US009437556B2

(12) United States Patent
Ishiguro

(10) Patent No.: US 9,437,556 B2
(45) Date of Patent: Sep. 6, 2016

(54) SEMICONDUCTOR DEVICE

(71) Applicant: Renesas Electronics Corporation, Kawasaki-shi, Kanagawa (JP)

(72) Inventor: Hisashi Ishiguro, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/680,910

(22) Filed: Apr. 7, 2015

(65) Prior Publication Data
US 2015/0287684 A1   Oct. 8, 2015

(30) Foreign Application Priority Data
Apr. 7, 2014  (JP) .................................. 2014-078849

(51) Int. Cl.
| H01L 29/00 | (2006.01) |
|---|---|
| H01L 23/544 | (2006.01) |
| H01L 23/02 | (2006.01) |
| H01L 23/58 | (2006.01) |
| H01L 23/528 | (2006.01) |
| H01L 23/00 | (2006.01) |
| H01L 23/522 | (2006.01) |

(52) U.S. Cl.
CPC ......... *H01L 23/585* (2013.01); *H01L 23/5283* (2013.01); *H01L 24/05* (2013.01); *H01L 23/5226* (2013.01); *H01L 2924/13091* (2013.01)

(58) Field of Classification Search
CPC .......... H01L 2224/73265; H01L 2224/48247; H01L 23/585; H01L 29/7811; H01L 24/49; H01L 2224/48463; H01L 2224/48145; H01L 21/78; H01L 27/0207; H01L 2224/49113; H01L 27/14636; B41J 2002/14491

USPC .............. 257/499, 508, 618, 620, 678, 797; 438/113, 460, 462
See application file for complete search history.

(56) References Cited

U.S. PATENT DOCUMENTS

| 7,224,059 B2 * | 5/2007 | Shimada ................. H01L 23/38 257/712 |
| 7,888,777 B2 * | 2/2011 | Hayasaki .............. H01L 23/562 257/620 |
| 8,008,788 B2 * | 8/2011 | Koketsu ................ H01L 23/544 257/797 |

FOREIGN PATENT DOCUMENTS

| JP | 2009-076782 A | 4/2009 |
| JP | 2012-160547 A | 8/2012 |

* cited by examiner

*Primary Examiner* — Hsien Ming Lee
(74) *Attorney, Agent, or Firm* — Shapiro, Gabor and Rosenberger, PLLC

(57) ABSTRACT

The reliability of a semiconductor device is improved. Further, miniaturization of the semiconductor device is attained. A sealring is formed in a wiring structure provided over a semiconductor substrate. The sealring has a structure in which sealring wirings respectively formed in a plurality of wiring layers included in the wiring structure are laminated. The position of a side surface on the inner peripheral side of a sealring wiring formed in the wiring layer at the uppermost layer in the wiring layers is located more outside than the position of a side surface on the inner peripheral side of a sealring wiring formed in the wiring layer located one layer lower than the wiring layer at the uppermost layer. The width of the sealring wiring at the uppermost layer is smaller than the width of the sealring wiring located one layer lower than the wiring layer at the uppermost layer.

8 Claims, 21 Drawing Sheets

SEMICONDUCTOR DEVICE

CROSS-REFERENCE TO RELATED APPLICATIONS

The disclosure of Japanese Patent Application No. 2014-078849 filed on Apr. 7, 2014 including the specification, drawings and abstract is incorporated herein by reference in its entirety.

BACKGROUND

The present invention relates to a semiconductor device, and is suitably available in a semiconductor device having a sealring, for example.

Semiconductor elements such as transistors are formed in a semiconductor substrate, and a wiring structure including a plurality of wiring layers is formed over the semiconductor substrate so as to cover the semiconductor elements to thereby manufacture a semiconductor device. There has been a technology which forms a sealring in this wiring structure.

A technology related to a semiconductor device having a sealring has been described in Japanese Unexamined Patent Publication Laid-Open No. 2009-76782 (Patent Document 1) and Japanese Unexamined Patent Publication Laid-Open No. 2012-160547 (Patent Document 2).

RELATED ART DOCUMENTS

Patent Documents

[Patent Document 1] Japanese Unexamined Patent Publication Laid-Open No. 2009-76782
[Patent Document 1] Japanese Unexamined Patent Publication Laid-Open No. 2012-160547

SUMMARY

It has been desired to improve reliability as much as possible even in a semiconductor device having a sealring. Alternatively, it has been desired to attain miniaturization thereof as much as possible, or it has been desired to improve reliability and reduce the size.

Other problems and novel features will be apparent from the description of the present specification and the accompanying drawings.

According to one aspect of the present invention, there is provided a semiconductor device which includes a sealring. The sealring has a structure in which sealring wirings respectively formed in a plurality of wiring layers included in a wiring structure provided over a semiconductor substrate are laminated. The position of a side surface on the inner peripheral side of a first sealring wiring as the sealring wiring formed in the wiring layer at the uppermost layer of the wiring layers is located more outside than the position of a side surface on the inner peripheral side of a second sealring wiring as the sealring wiring formed in the wiring layer located one layer lower than the wiring layer at the uppermost layer of the wiring layers. And, the width of the first sealring wiring is smaller than the width of the second sealring wiring.

According to the one aspect, it is possible to enhance the reliability of a semiconductor device.

Alternatively, it is possible to attain miniaturization of the semiconductor device.

Alternatively, it is possible to improve the reliability of the semiconductor device and attain miniaturization thereof.

DETAILED DESCRIPTION

Figure 1:
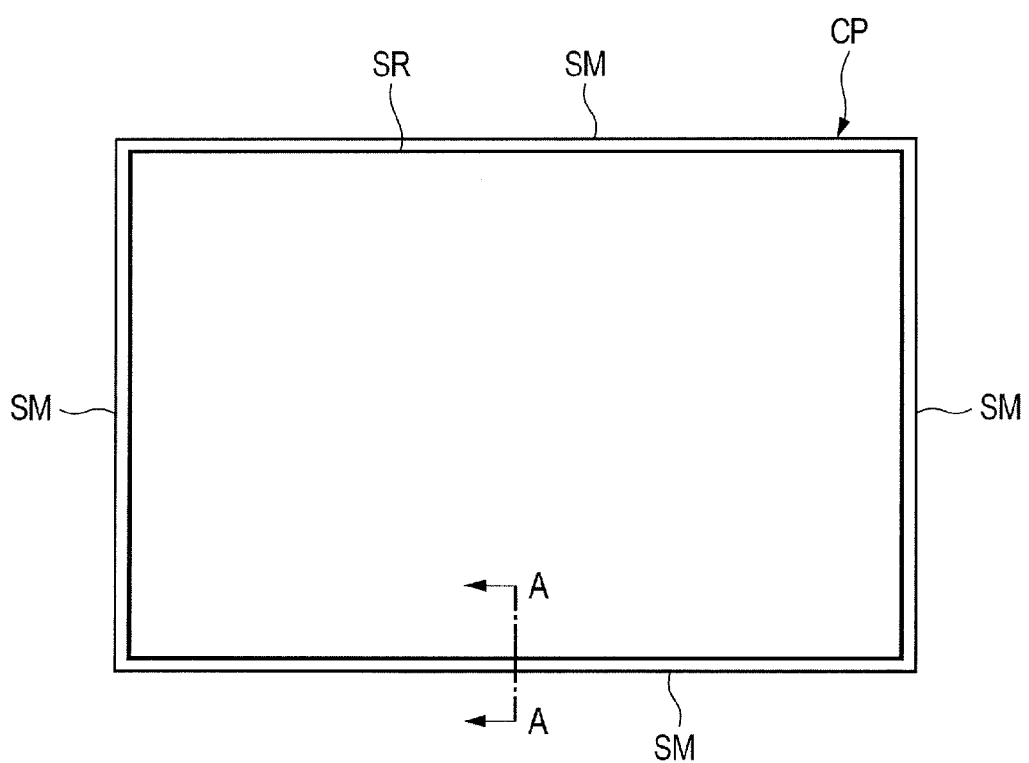
FIG. 1 is an overall plan view of a semiconductor device according to one embodiment.

The invention will be described by being divided into a plurality of sections or embodiments whenever circumstances require it for convenience in the following embodiments. However, unless otherwise specified in particular, they are not irrelevant to one another. One thereof has to do with modifications, details and supplementary explanations of some or all of the other. When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle. It is further needless to say that components (including element or factor steps, etc.) employed in the following embodiments are not always essential unless otherwise specified in particular and considered to be definitely essential in principle. Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

Embodiments will hereinafter be described in detail based on the accompanying drawings. Incidentally, components having the same function are denoted by the same reference numerals throughout the drawings for describing the embodiments, and the repetitive description thereof will be omitted. Also, in the embodiments described below, descriptions of the same or similar components are not repeated in principle except the case where the descriptions are particularly necessary.

Also, in the drawings used in the embodiments, hatching may be omitted even in a cross-sectional view so as to make the drawings easy to see. Further, hatching may be used even in a plan view so as to make the drawings to be seen easily.

(Embodiment 1)
<Structure of Semiconductor Device>

A semiconductor device according to the present embodiment will be described with reference to the accompanying drawings. The semiconductor device according to the present embodiment is a semiconductor device having a sealring.

Figure 2:
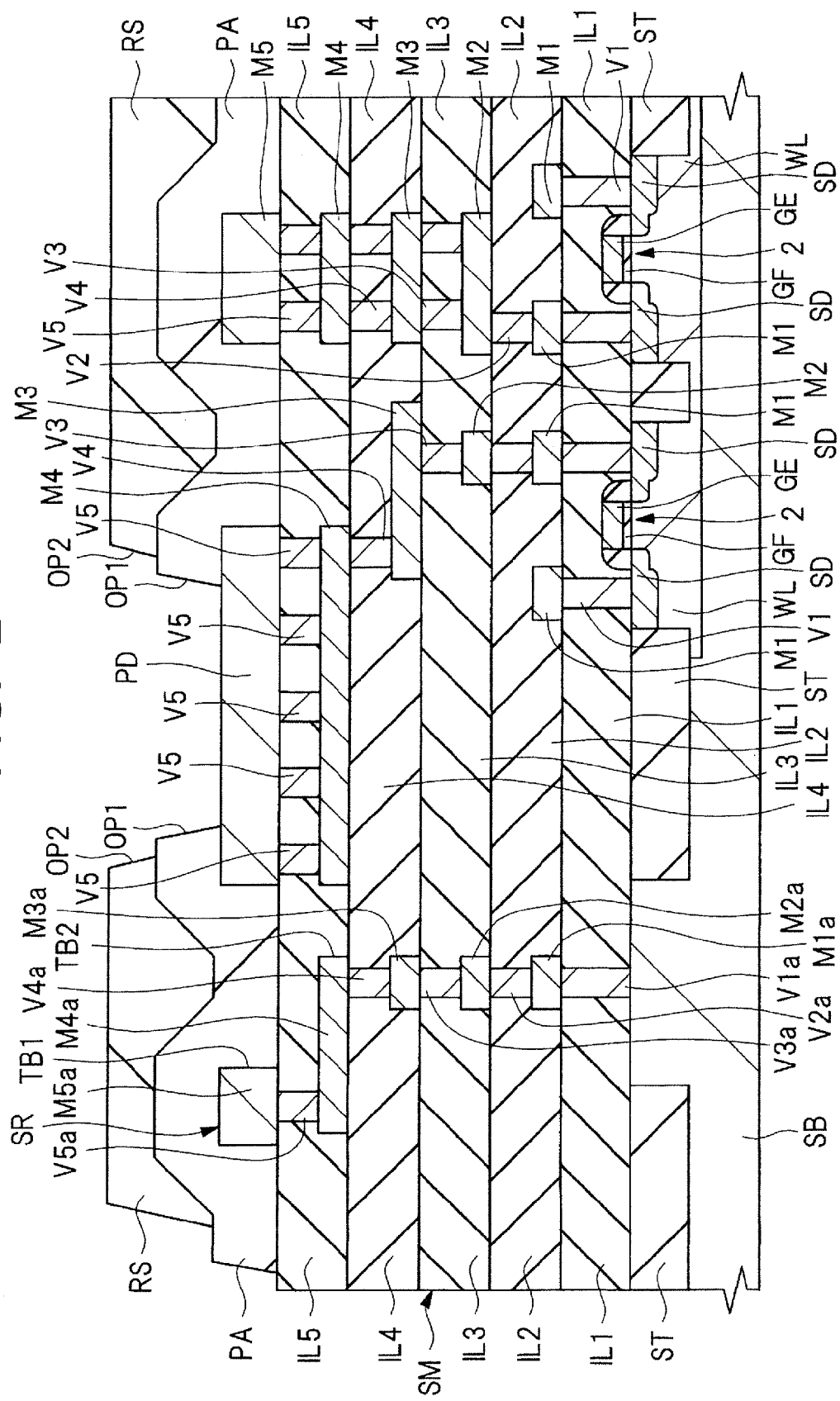
FIG. 2 is a fragmentary sectional view of the semiconductor device according to the one embodiment.
Figure 3:
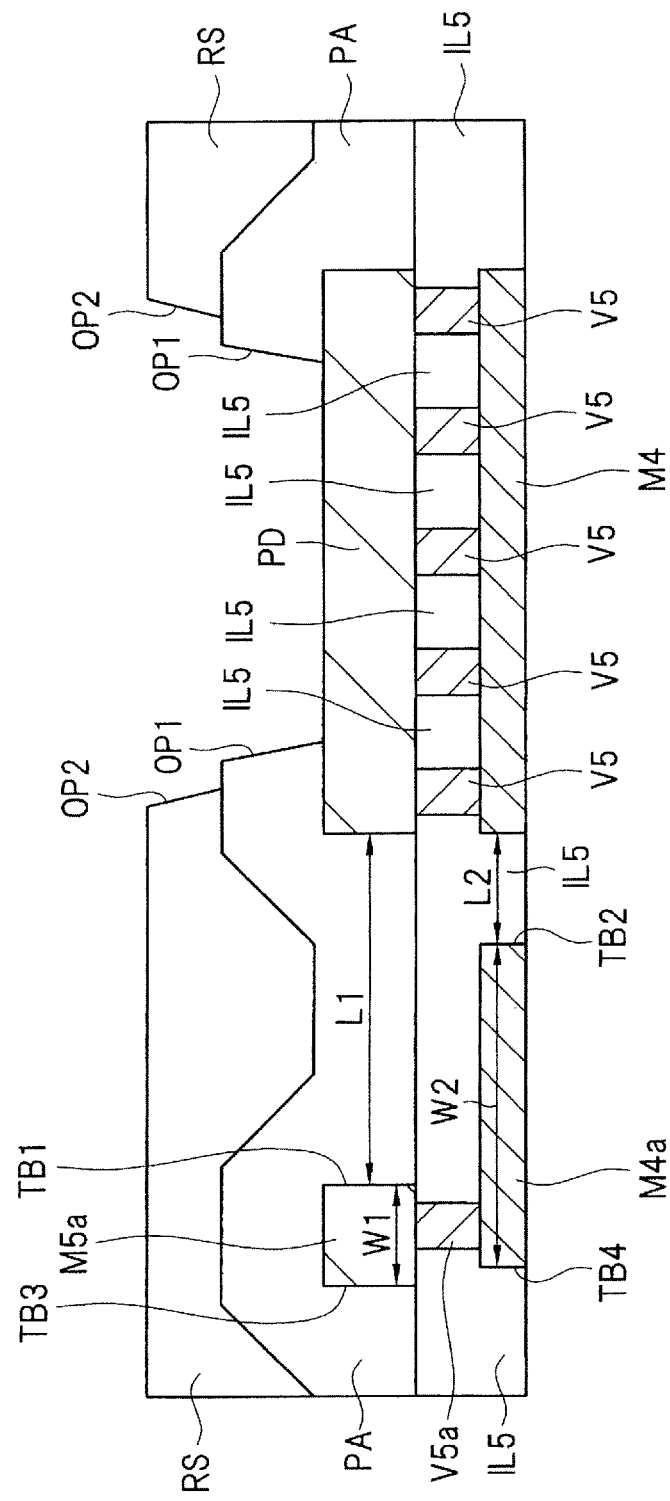
FIG. 3 is a fragmentary sectional view of the semiconductor device according to the one embodiment.
Figure 4:
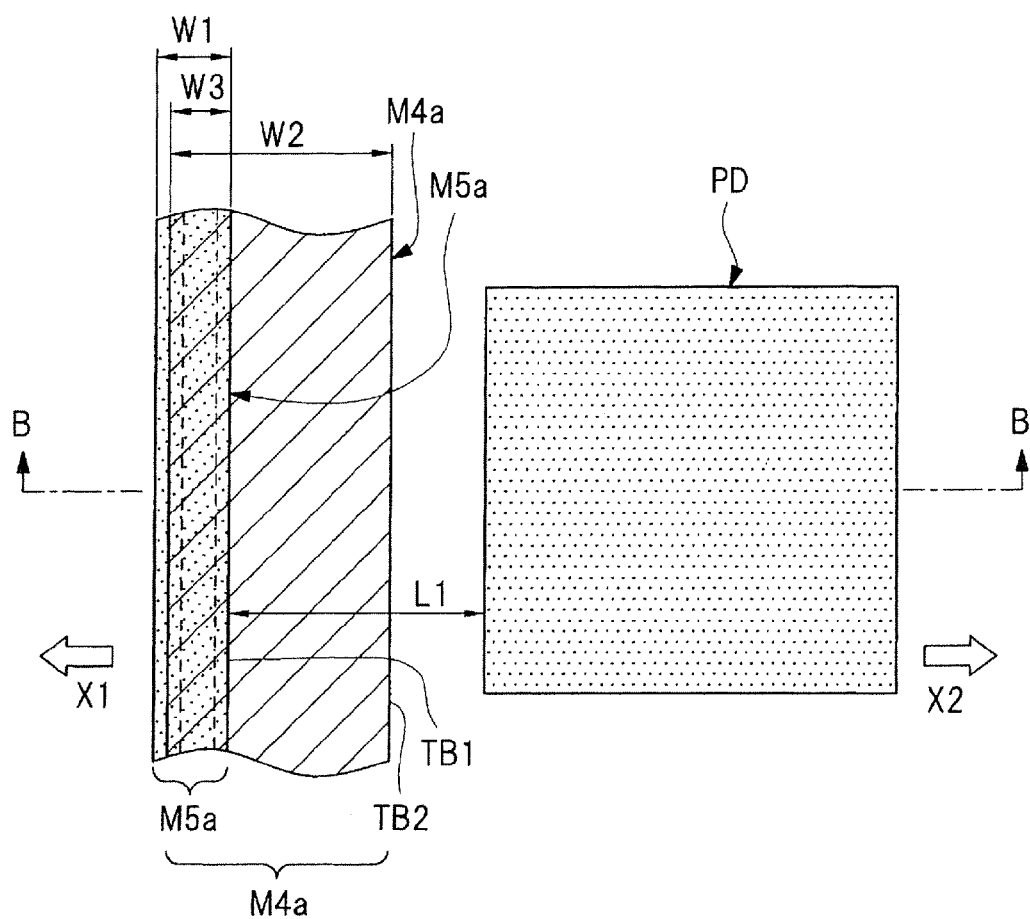
FIG. 4 is a fragmentary plan view of the semiconductor device according to the one embodiment.

FIG. 1 is an overall plan view of the semiconductor device (CP) according to the present embodiment and shows in a see-through manner, a position where a sealring SR is formed. FIG. 2 is a fragmentary sectional view showing a sectional structure of the semiconductor device (CP) according to the present embodiment. A sectional view taken along line A-A of FIG. 1 substantially corresponds to FIG. 2. In FIG. 2, the left end of the semiconductor device is a side surface SM of the semiconductor device CP and corresponds to a cut surface when a semiconductor wafer is cut along a scribe area. Also, in FIG. 2, the right end of the semiconductor device does not correspond to the side surface of the semiconductor device CP but corresponds to a certain position inside the semiconductor device CP. FIG. 3 is a fragmentary sectional view of the semiconductor device (CP) according to the present embodiment, but corresponds to a part of FIG. 2 which is shown by extracting the same therefrom. A sectional view showing the structure of a layer above an interlayer insulating film IL4 is illustrated therein. FIG. 4 is a fragmentary plan view of the semiconductor device (CP) according to the present embodiment. A sectional view taken along line B-B of FIG. 4 substantially corresponds to FIG. 3. In FIG. 4, a direction X1 (i.e., left direction) corresponds to the direction toward the side surface SM (outside) of the semiconductor device CP with the sealring SR as a reference, and a direction X2 (i.e., right direction) corresponds to the direction toward the interior (inside) of the semiconductor device CP with the sealring SR as the reference. Thus, in FIG. 3, the left direction corresponds to the direction toward the side surface SM (outside) of the semiconductor device CP, and the right direction corresponds to the direction toward the interior (inside) of the semiconductor device CP.

Incidentally, although FIG. 3 is a sectional view, hatching is omitted to make it easy to see the drawing in terms of an interlayer insulating film IL5, an insulating film PA, and an insulating film RS. Also, although FIG. 4 is a plane view, oblique hatching is applied to a sealring wiring M4a so as to make it easier to understand a planar shape of each member, and a sealring wiring M5a and a pad PD are dot-hatched. Further, in FIG. 4, a via portion 5a for the sealring is indicated by a broken line.

The semiconductor device CP according to the present embodiment is a semiconductor device (semiconductor chip) formed using a semiconductor substrate SB comprised of single crystal silicon or the like and has a circuit forming area and a sealring forming area.

As shown in FIG. 1, the sealring SR is formed in the outer peripheral part of the semiconductor device (semiconductor chip) CP. The sealring may be referred to as a guard ring. The sealring SR is formed in the outer peripheral part of the semiconductor device CP so as to go around along the outer periphery of the semiconductor device CP. Therefore, the sealring SR is formed in a loop shape (ring shape) along the outer periphery of the semiconductor device CP in plan view, but corresponding to the outer shape of the semiconductor device CP being substantially rectangular, the outer shape of the sealring SR can be configured as a substantially rectangular shape or a shape given roundness at the corners of the rectangular shape, or a shape in which the rectangular corners are chamfered. In the semiconductor device CP, various circuits and semiconductor elements are formed within an area surround by the sealring SR in plan view. Therefore, in the semiconductor device CP, the sealring SR is provided so as to surround the circuit forming area in plan view. A MISFET 2, via portions V1, V2, V3, V4, and V5, wirings M1, M2, M3, M4, and M5, and the pad PD to be described later are formed within the area (circuit forming area) surrounded by the sealring SR in plan view in the semiconductor device CP.

As will be described later, the semiconductor device (CP) has a structure wherein a multilayer wiring structure is formed over the semiconductor substrate SB. Therefore, the sealring SR is formed along the periphery (outer periphery) of the semiconductor substrate SB in the multilayer wiring structure. Here, the multilayer wiring structure corresponds to a wiring structure including a plurality of wiring layers.

Incidentally, the terms of the "plan view" or "as viewed in plan view" are assumed to indicate when viewed in a plane parallel to a main surface of the semiconductor substrate SB.

A specific configuration of the semiconductor device CP according to the present embodiment will next be described while referring to FIG. 2.

As illustrated in FIG. 2, the semiconductor substrate SB comprised of the single crystal silicon or the like configuring the semiconductor device CP according to the present embodiment is formed with semiconductor elements such as MISFETs (Metal Insulator Semiconductor Field Effect Transistors) 2. The semiconductor elements are formed within an area surrounded by the sealring SR in plan view.

For example, an element isolation region ST is formed in the semiconductor substrate SB by a LOCOS (Local oxidation of silicon) method or an STI (Shallow Trench Isolation) method or the like. A well region WL is formed in an active region of the semiconductor substrate SB defined by the element isolation region SR. The well region WL is an n-type semiconductor region (n-type well region) in a region which forms a p channel type MISFET. The well region WL is a p-type semiconductor region (p-type well region) in a region which forms an n channel type MISFET. Then, a gate electrode GE is formed over the well region WL of the semiconductor substrate SB through a gate insulating film GF. Source-drain regions SD of each MISFET are formed within the well region WL of the semiconductor substrate SB. In the region to form the p channel type MISFET, each source-drain region SD is a p-type semiconductor region. In the region to form the n channel type MISFET, each source-drain region SD is an n-type semiconductor region. The MISFET 2 is formed by the gate electrode GE, the gate insulating film GF located below the gate electrode GE, and the source-drain regions SD on both sides of the gate electrode GE. Each source-drain region SD can also be taken as an LDD (Lightly Doped Drain) structure. In this case, a side wall insulating film also called a side wall spacer is formed over the wall of the gate electrode GE.

An n channel type MISFET or a p channel type MISDFET, or both of the n channel type MISFET and the p channel MISFET can be formed as MISFETs 2.

Further, although a description has been made here by taking for example MISFETs as the semiconductor elements, a capacitive element, a resistive element, a memory element or transistors of other configurations can also be formed in addition to the above.

A wiring structure (multilayer wiring structure) is formed over the semiconductor substrate SB by a plurality of interlayer insulating films and a plurality of wiring layers.

That is, a plurality of interlayer insulating films IL1, IL2, IL3, IL4, and IL5 are formed over the semiconductor substrate SB. The via portions (connection parts, conductive plugs) V1, V2, V3, V4, and V5, and the wirings M1, M2, M3, M4, and M5 are formed in the interlayer insulating films IL1, IL2, IL3, IL4, and IL5.

Specifically, the interlayer insulating film IL1 is formed over the semiconductor substrate SB as an insulting film so as to cover the MISFETs 2. The wiring M1 is formed over the interlayer insulating film IL1. The wiring M1 is a wiring of a first wiring layer corresponding to a wiring layer at the lowermost wiring layer. The interlayer insulating film IL2 is formed over the interlayer insulating film IL1 as an insulating film so as to cover the wiring M1. The wiring M2 is formed over the interlayer insulating film IL2. The wiring M2 is a wiring of a second wiring layer being a wiring layer located one layer higher than the first wiring layer. The interlayer insulating film IL3 is formed over the interlayer insulating film IL2 as an insulating film so as to cover the wiring M2. The wiring M3 is formed over the interlayer insulating film IL3. The wiring M3 is a wiring of a third wiring layer being a wiring layer located one layer higher than the second wiring layer. The interlayer insulating film IL4 is formed over the interlayer insulating film IL3 as an insulating film so as to cover the wiring M3. The wiring M4 is formed over the interlayer insulating film IL4. The wiring M4 is a wiring of a fourth wiring layer being a wiring layer located one layer higher than the third wiring layer. The interlayer insulating film IL5 is formed over the interlayer insulating film IL4 as an insulating film so as to cover the wiring M4. The wiring M5 is formed over the interlayer insulating film IL5. The wiring M5 is a wiring of a fifth wiring layer being a wiring layer located one layer higher than the fourth wiring layer. An insulating film PA is formed over the interlayer insulating film IL5 so as to cover the wiring M5. An insulating film (resin film) RS comprised of a resin film is formed over the insulating film PA as the film of the uppermost layer.

The via portion V1 is formed in the interlayer insulating film IL1. The via portion V1 is comprised of a conductor and formed in a layer below the wiring M1. That is, the via portion V1 is formed in the interlayer insulating film IL1 so as to penetrate the interlayer insulating film IL1. The via portion V1 is electrically coupled to the wiring M1 by allowing the upper surface of the via portion V1 to contact the lower surface of the wiring M1. Further, the bottom of the via portion V1 is coupled to various semiconductor regions (e.g., source-drain region SD, etc.) formed in the semiconductor substrate SB and various conductive members (e.g., gate electrode GE, etc.) formed over the semiconductor substrate SB. Thus, the wiring M1 can be electrically coupled to the various semiconductor regions formed in the semiconductor substrate SB and the various conductive members formed over the semiconductor substrate SB.

The via portion V2 is formed in the interlayer insulating film IL2. The via portion V2 is comprised of a conductor and formed between the wiring M2 and the wiring M1. That is, the via portion V2 is formed in the interlayer insulating film IL2 and couples the wiring M2 and the wiring M1. Thus, the wiring M2 and the wiring M1 can be electrically coupled to each other through the via portion V2. The via portion V2 can also be formed integrally with the wiring M2.

The via portion (connection part, conductive plug) V3 is formed in the interlayer insulating film IL3. The via portion V3 is comprised of a conductor and formed between the wiring M3 and the wiring M2. That is, the via portion V3 is formed in the interlayer insulating film IL3 and couples the wiring M3 and the wiring M2. Thus, the wiring M3 and the wiring M2 can be electrically coupled to each other through the via portion V3. The via portion V3 can also be formed integrally with the wiring M3.

The via portion V4 is formed in the interlayer insulating film IL4. The via portion V4 is comprised of a conductor and formed between the wiring M4 and the wiring M3. That is, the via portion V4 is formed in the interlayer insulating film IL4 and couples the wiring M4 and the wiring M3. Thus, the wiring M4 and the wiring M3 can be electrically coupled to each other through the via portion V4. The via portion V4 can also be formed integrally with the wiring M4.

The via portion V5 is formed in the interlayer insulating film IL5. The via portion V5 is comprised of a conductor and formed between the wiring M5 and the wiring M4. That is, the via portion V5 is formed in the interlayer insulating film IL5 and couples the wiring M5 and the wiring M4. Thus, the wiring M5 and the wiring M4 can be electrically coupled to each other through the via portion V5. The via portion V5 can also be formed integrally with the wiring M5.

In the semiconductor device CP according to the present embodiment, the fifth wiring layer, i.e., the wiring M5 is the uppermost layer wiring. That is, desired wire coupling between the various elements (e.g., above MISFET 2, etc.) formed in the semiconductor substrate SB is done by the first wiring layer (wiring M1), the second wiring layer (wiring M2), the third wiring layer (wiring M3), the fourth wiring layer (wiring M4), and the fifth wiring layer (wiring M5), so that a desired operation can be achieved.

The pad (pad region, pad electrode) PD is formed by the fifth wiring layer corresponding to the uppermost layer wiring. That is, the pad PD is formed in the same layer as the wiring M5. In other words, the wiring M5 and the pad PD are formed in the same process by a conductive layer of the same layer. Therefore, the pad PD is formed over the interlayer insulating film IL5. Although the pad PD can also be assumed to be a part of the wiring M5, the wiring M5 is covered with the insulating films PA and RS, whereas the pad PD is at least partially exposed from openings (OP1 and OP2) of the insulating films PA and RS. That is, the wiring M5 is covered with a laminated film (laminated insulating film) of the insulating film PA and the insulating film RS provided over the insulating film PA, but at least part of the pad PD is exposed without being covered with both of the insulating film PA and the insulating film RS.

Specifically, the opening OP1 is formed in the insulating film PA at a position where it overlaps with a part of the pad PD in plan view, and the part of the pad PD is exposed from the opening OP1 of the insulating film PA. Of the pad PD, a portion which does not overlap with the opening OP1 of the insulating film PA in plan view, is covered with the insulating film PA. Further, the opening OP2 is formed even in the insulating film RS at a position where it overlaps with a part of the pad PD in plan view. The opening OP2 of the insulating film RS is formed so as to include the opening OP1 of the insulting film PA in plan view. Therefore, the part of the pad PD is exposed from the opening OP2 of the insulating film RS and the opening OP1 of the insulating film PA.

The pad PD exposed from the opening OP2 of the insulating film RS and the opening OP1 of the insulating film PA can function as an external terminal of the semiconductor device CP. For example, a conductive coupling member such as a bonding wire can be coupled to the pad PD exposed from the opening OP2 of the insulating film RS and the opening OP1 of the insulating film PA. Alternatively, a bump electrode can be formed over or coupled to the pad PD exposed from the opening OP2 of the insulating film RS and the opening OP1 of the insulating film PA.

Further, it is also possible to form a base metal film (not shown) over the pad PD and then expose the base metal film lying over the pad PD from the opening OP2 of the insulating film RS and the opening OP1 of the insulating film PA. The base metal film is comprised of, for example, a laminated film of a nickel (Ni) film and a gold (Au) film provided over the nickel (Ni), or the like. Thus, since a conductive coupling member such as a bonding wire is coupled to the base metal film exposed from the opening OP2 of the insulating film RS and the opening OP1 of the insulating film PA, the coupling member (bonding wire or the like) can be made easy to be coupled thereto.

The wiring M5 corresponding to the uppermost layer wiring and the pad PD are preferably comprised of a conductive material (conductive material showing metallic conductivity) comprised principally (mainly) of aluminum (Al). In this case, the pad PD is preferably an aluminum pad comprised mainly of aluminum, and the wiring M5 is preferably an aluminum wiring comprised mainly of aluminum. Taking materials suitable for the wiring M5 and the pad PD by way of example, there are pure aluminum (Al), a compound or alloy of Al (aluminum) and Si (silicon), a compound or alloy of Al (Aluminum) and Cu (copper), or a compound or alloy of Al, Si and Cu, etc. The composition ratio of Al is preferably larger than 50 atomic % (i.e., Al-rich).

Also, the insulating film RS corresponding to the uppermost layer film is provided as a resin film (organic insulating film) like a polyimide resin or the like to thereby enable facilitation of handling of a semiconductor device (semiconductor chip) with a comparatively soft resin film (organic insulating film) as an uppermost layer.

Further, as illustrated in FIGS. 1 through 4, the sealring (guard ring) SR is formed in the outer peripheral part of the semiconductor device CP.

The sealring SR is formed by wirings (metal patterns) M1a, M2a, M3a, M4a, and M5a for the sealring, and via portions (metal patterns) V1a, V2a, V3a, V4a, and V5a for the sealring.

The sealring wiring M1a is formed of the same material in the same layer and process as the wiring M1. Also, the sealring wiring M2a is formed of the same material in the same layer and process as the wiring M2. Further, the sealring wiring M3a is formed of the same material in the same layer and process as the wiring M3. Furthermore, the sealring wiring M4a is formed of the same material in the same layer and process as the wiring M4. Still further, the sealring wiring M5a is formed of the same material in the same layer and process as the wiring M5.

Further, the sealring via portion V1a is formed of the same material in the same layer and process as the via portion V1. Furthermore, the sealring via portion V2a is formed of the same material in the same layer and process as the via portion V2, the sealring via portion V3a is formed of the same material in the same layer and process as the via portion V3, the sealring via portion V4a is formed of the same material in the same layer and process as the via portion V4, and the sealring via portion V5a is formed of the same material in the same layer and process as the via portion V5, respectively.

Therefore, the sealring wirings M1a, M2a, M3a, M4a, and M5a, and the via portions V1a, V2a, V3a, V4a, and V5a are respectively formed principally of a metal material as with the wirings M1, M2, M3, M4, and M5 and the via portions V1, V2, V3, V4, and V5. The sealring via portion V1a, wiring M1a, via portion V2a, wiring M2a, via portion V3a, wiring M3a, via portion V4a, wiring M4a, via portion V5a, and wiring M5a can also respectively be assumed to be metal patterns for the sealring SR.

Further, the thickness of the sealring wiring M1a is substantially the same as that of the wiring M1. The thickness of the sealring wiring M2a is substantially the same as that of the wiring M2. The thickness of the sealring wiring M3a is substantially the same as that of the wiring M3. The thickness of the sealring wiring M4a is substantially the same as that of the wiring M4. In addition, the thickness of the sealring wiring M5a is substantially the same as the thickness of the wiring M5 and the thickness of the pad PD. Here, while the wiring structure (multilayer wiring structure) including the wiring layers has been formed over the semiconductor substrate SB, the thicknesses of the wiring (wiring M5 herein) and the pad (pad PD herein) formed in the uppermost wiring layer become thicker than the thicknesses of the wirings (wirings M1, M2, M3, and M4 herein) each formed in the wiring layer lower than the uppermost wiring layer. Therefore, the thickness of the sealring wiring M5a formed in the uppermost wiring layer become thicker than the thicknesses of the sealring wirings M4a, M3a, M2a, and M1a each formed in the wiring layer lower than the uppermost wiring layer.

The sealring SR is formed in a metal wall shape by the sealring wirings M1a, M2a, M3a, M4a, and M5a, and the sealring via portions V1a, V2a, V3a, V4a, and V5a. That is, the sealring SR is formed in the metal wall shape by vertically arranging the sealring wiring M5a and via portion V5a, the sealring wiring M4a and via portion V4a, the sealring wiring M3a and via portion V3a, the sealring wiring M2a and via portion V2a, and the sealring wiring M1a and via portion V1a. That is, the sealring via portion V1a and wiring M1a, the sealring via portion V2a and wiring M2a, the sealring via portion V3a and wiring M3a, the sealring via portion V4a and wiring M4a, and the sealring via portion V5a and wiring M5a are different in terms of their formed layers and stacked over one another in this order from bottom to top to form the sealring SR as a whole.

The sealring SR is formed in the outer peripheral part of the semiconductor device CP so as to go around along the outer periphery of the semiconductor device CP in plan view. Therefore, the sealring via portion V1a and wiring M1a, the sealring via portion V2a and wiring M2a, the sealring via portion V3a and wiring M3a, the sealring via portion V4a and wiring M4a, and the sealring via portion V5a and wiring M5a are respectively formed in the outer peripheral part of the semiconductor device CP so as to be circulated along the outer periphery of the semiconductor device CP in plan view.

The sealring via portion V1a is arranged in a region in which it overlaps with the sealring wiring M1a in plan view, and is coupled to the sealring wiring M1a. The sealring via portion V2a is arranged in a region in which the sealring wiring M1a and the sealring wiring M2a overlap each other in plan view. The sealring wiring M1a and the sealring wiring M2a are coupled to each other through the sealring via portion V2a. Also, the sealring via portion V3a is arranged in a region in which the sealring wiring M2a and the sealring wiring M3a overlap each other in plan view. The sealring wiring M2a and the sealring wiring M3a are coupled to each other through the sealring via portion V3a. Further, the sealring via portion V4a is arranged in a region in which the sealring wiring M3a and the sealring wiring M4a overlap each other in plan view. The sealring wiring M3a and the sealring wiring M4a are coupled to each other through the sealring via portion V4a. Furthermore, the sealring via portion V5a is arranged in a region in which the sealring wiring M4a and the sealring wiring M5a overlap each other. The sealring wiring M4a and the sealring wiring M5a are coupled to each other through the sealring via portion V5a.

Therefore, the sealring via portion V1a and the sealring wiring M1a overlap each other in plan view, and the sealring wiring M1a and the sealring via portion V2a overlap each other in plan view. Also, the sealring via portion V2a and the sealring wiring M2a overlap each other in plan view, and the sealring wiring M2a and the sealring via portion V3a overlap each other in plan view. Further, the sealring via portion V3a and the sealring wiring M3a overlap each other in plan view, and the sealring wiring M3a and the sealring via portion V4a overlap each other in plan view. Furthermore, the sealring via portion V4a and the sealring wiring M4a overlap each other in plan view, and the sealring wiring M4a and the sealring via portion V5a overlap each other in plan view. The sealring via portion V5a and the sealring wiring M5a overlap each other in plan view.

That is, the sealring wiring M2a and the sealring wiring M1a are coupled by the sealring via portion V2a arranged between the sealring wiring M2a and the sealring wiring M1a. Also, the sealring wiring M3a and the sealring wiring M2a are coupled by the sealring via portion V3a arranged between the sealring wiring M3a and the sealring wiring M2a. Further, the sealring wiring M4a and the sealring wiring M3a are coupled by the sealring via portion V4a arranged between the sealring wiring M4a and the sealring wiring M3a. Furthermore, the sealring wiring M5a and the sealring wiring M4a are coupled by the sealring via portion V5a arranged between the sealring wiring M5a and the sealring wiring M4a.

When a crack occurs in a cut surface by a dicing blade in a dicing process (cutting process) at the manufacture of the semiconductor device CP due to the provision of the sealring SR, it is possible to stop the extension of the crack by the sealring SR. Incidentally, the cut surface in the dicing process corresponds to the side surface SM of the semiconductor device CP. Further, the sealring SR is capable of stopping infiltration of moisture from the cut surface (side surface SM) of the semiconductor device. That is, the sealring SR has a barrier function to the extension of the crack from the cut surface due to dicing and infiltration of moisture. Accordingly, it is possible to improve the reliability of the semiconductor device by the provision of the sealring SR.

Therefore, the sealring wirings M1a, M2a, M3a, M4a, and M5a, and the sealring via portions V1a, V2a, V3a, V4a, and V5 are not formed to couple between the elements or circuits, but are formed to form the sealring SR. The wirings M1, M2, M3, M4, and M5 are wirings other than for the sealring and are formed to couple between the elements or circuits, for example.

Figure 5:
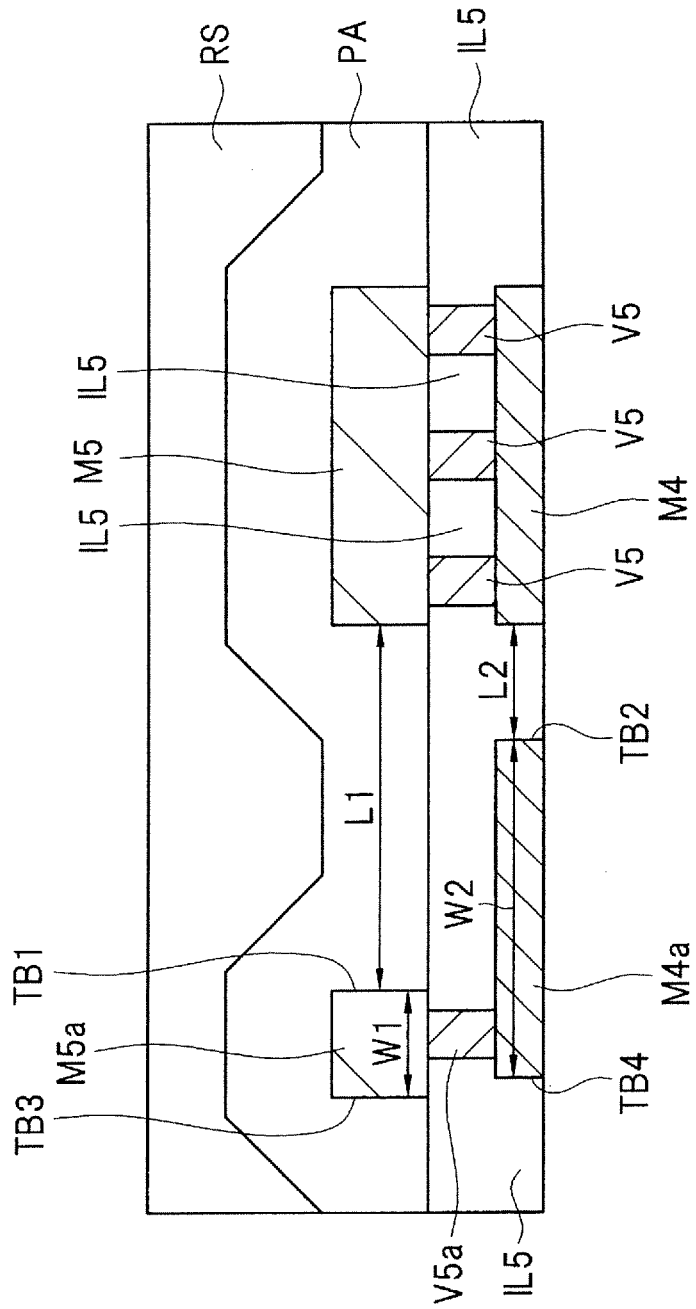
FIG. 5 is a fragmentary sectional view of the semiconductor device according to the one embodiment.
Figure 6:
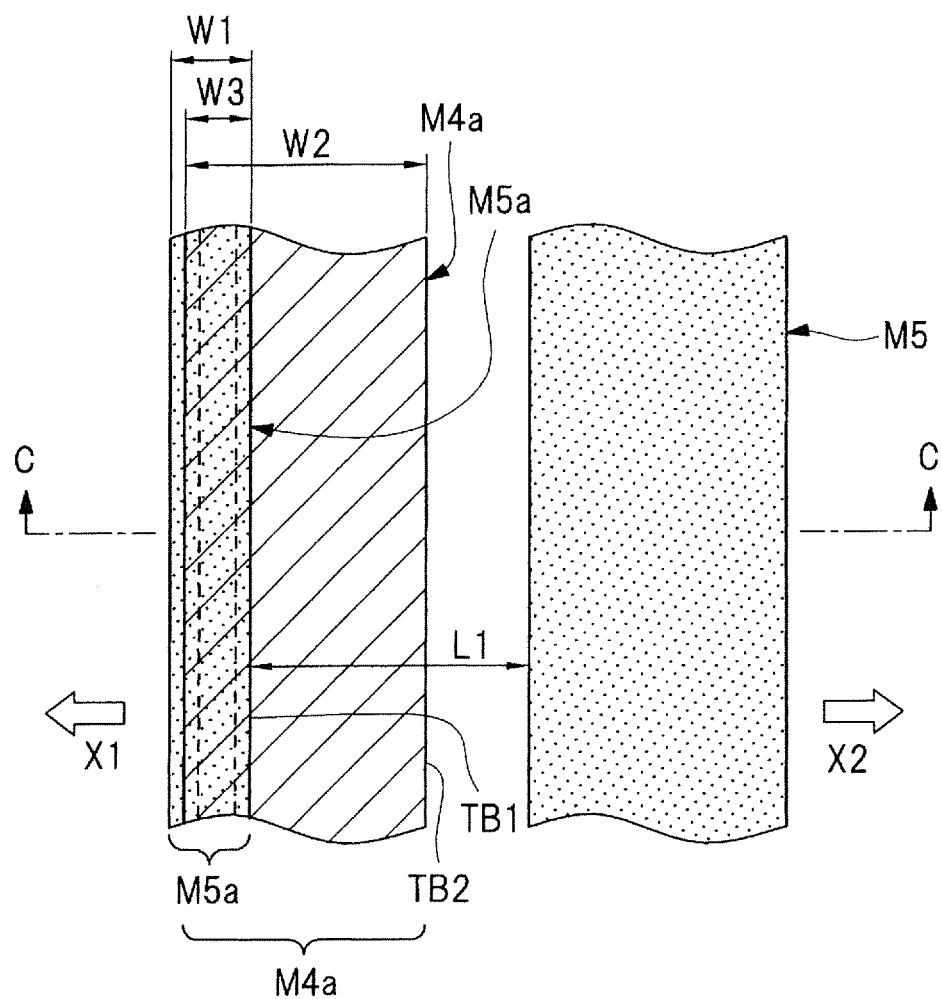
FIG. 6 is a fragmentary plan view of the semiconductor device according to the one embodiment.

The semiconductor device (CP) according to the present embodiment is provided with the wiring structure (multilayer wiring structure) formed over the semiconductor substrate SB and including the wiring layers. This wiring structure has the sealring SR formed along the periphery (outer periphery) of the semiconductor substrate SB. The sealring SR has a structure in which the sealring wirings (M1a through M5a) respectively formed with the wiring layers configuring the wiring structure are laminated. Of the wiring layers configuring the wiring structure, the uppermost wiring layer is formed with the sealring wiring M5a, pad PD and wiring M5. That is, the sealring wiring M5a, pad PD and wiring M5 are formed in the same layer (specifically, the wiring layer at the uppermost layer). Therefore, the pad PD or the wiring M5 is arranged at a position adjacent to the sealring wiring M5a. There is shown in FIGS. 2 through 4, the pad PD which is adjacent to the sealring wiring M5a formed in the wiring layer at the uppermost layer. However, not the pad PD but the wiring M5 may possibly adjacent to the sealring wiring M5a as shown in FIG. 5 and FIG. 6. FIG. 5 (fragmentary sectional view) and FIG. 6 (fragmentary plan view) respectively correspond to FIG. 3 and FIG. 4 shown above. In FIGS. 5 and 6, not the pad PD but the wiring M5 is adjacent to the sealring wiring M5a. Such a case is also included in the present embodiment.

Incidentally, as with FIG. 3 shown above, FIG. 5 shows a structure of a layer located higher than the interlayer insulating film IL4. Although FIG. 5 is a sectional view, the interlayer insulating film IL5, the insulating film PA and the insulating film RS are not hatched to make it easy to see the drawings. Further, FIG. 6 is a plan view in a manner similar to FIG. 4 shown above, but in order to make it easy to understand the planar shape of each member, oblique hatching is applied to the sealring wiring M4a, dot-hatching is applied to the sealring wiring M5a and the wiring M5, and the sealring via portion V5a is indicated by a broken line. A sectional view taken along line C-C of FIG. 6 substantially corresponds to FIG. 5.

<Manufacturing Process of Semiconductor Device>

A description will next be made about one example of a manufacturing process of the semiconductor device according to the present embodiment. It is possible to manufacture the semiconductor device shown in FIGS. 7 through 19 described above by the following manufacturing processes. FIGS. 7 through 19 are respectively fragmentary sectional views in the manufacturing process of the semiconductor device according to the present embodiment.

Figure 7:
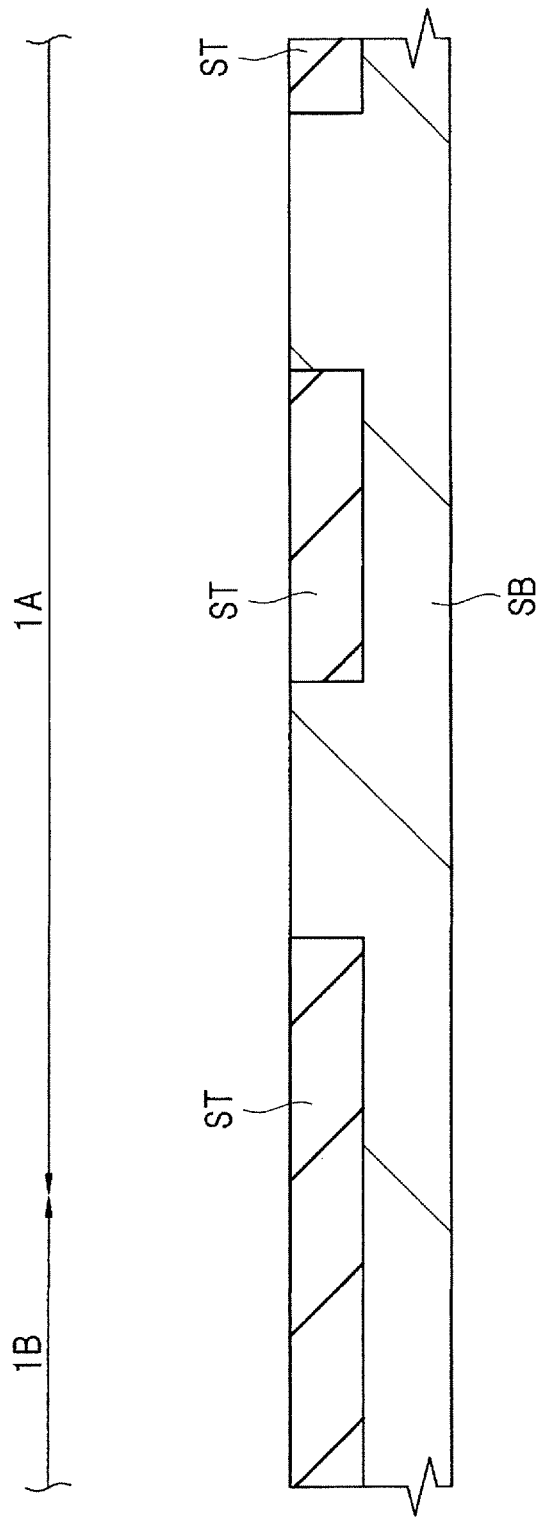
FIG. 7 is a fragmentary sectional view in a manufacturing process of the semiconductor device according to the one embodiment.

First, as shown in FIG. 7, a semiconductor substrate (semiconductor wafer) SB comprised of p-type single crystal silicon having a resistivity of 1 to 10Ω, for example is arranged (prepared). The semiconductor substrate SB in this stage is in a state of being an approximately disk-shaped semiconductor wafer.

Here, the semiconductor wafer (corresponding to the semiconductor substrate SB) has chip areas (semiconductor chip areas) each being a scheduled region in which a semiconductor chip (corresponding to the semiconductor device CP) is acquired therefrom, and scribe areas each provided between the respective chip areas. Each chip area is surrounded by the scribe areas in plan view. That is, in the semiconductor wafer, a plurality of chip areas are arranged in an array form, and an area between the chip areas arranged in the array form corresponds to the scribe area. Thus, in the semiconductor wafer, the chip areas arranged in the array form are partitioned by the scribe areas. In a dicing process (cutting process), the chip areas are divided into individual pieces by cutting (dicing) the semiconductor wafer along the scribe areas, which result in the semiconductor chips (each corresponding to the semiconductor device CP). In FIGS. 7 through 18, the chip area is indicated by a reference numeral 1A, and the scribe area is indicated by a reference numeral 1B. The chip area and the scribe area respectively correspond to planar areas different from each other on the main surface of the same semiconductor wafer (semiconductor substrate). Incidentally, a sealring SR formed in the following processes is formed within each chip area, but formed in an outer peripheral part of each chip area. That is, the sealring SR is formed in each chip area so as to go around along the outer periphery of each chip area. On the other hand, a MISFET 2, via portions V1, V2, V3, V4, and V5, wirings M1, M2, M3, M4, and M5, and a pad PD formed in the following processes are formed in an area surrounded by the sealring SR in plan view in each chip area.

A semiconductor element such as a MISFET is formed in the semiconductor substrate SB (active region thereof) of the chip area 1A. A description will briefly be made below about a forming process of the MISFET.

Figure 8:
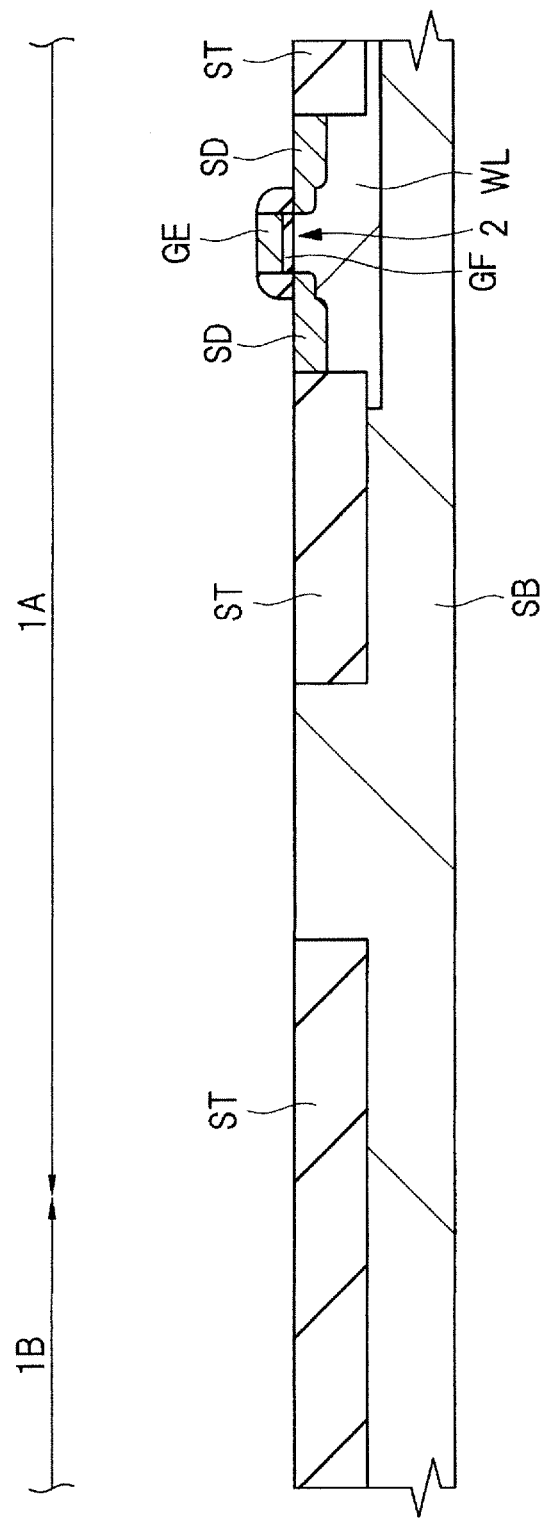
FIG. 8 is a fragmentary sectional view following FIG. 7 in the manufacturing process of the semiconductor device.

First, as shown in FIG. 7, element isolation regions ST are formed in the semiconductor substrate SB by the LOCOS method or STI method or the like. Then, as shown in FIG. 8, a well region WL is formed in the active region of the semiconductor substrate SB defined by the element isolation regions ST, using an ion implantation method or the like. A gate electrode GE is formed over the well region WL through a gate insulating film GF interposed therebetween. Then, each of source-drain regions SD is formed within the well region WL of the semiconductor substrate SB using the ion implantation method or the like. A side wall insulating film called a sidewall spacer is formed over the side wall of the gate electrode GE. The source-drain region SD can also be formed by performing ion implantation before and after the formation of the side wall insulating film. In such a case, the source-drain region SD has an LDD structure. Thereafter, annealing (heat treatment) for activating an impurity introduced by the ion implantation is carried out. Thus, the MISFET 2 is formed in the semiconductor substrate SB. Further, a metal silicide layer (not shown) having low resistance can also be formed over each upper part (surface layer portion) of the source-drain region SD and the gate electrode GE, etc.

As the MISFET 2, an n channel type MISFET or a p channel type MISFET, or both of the n channel type MISFET and the p channel type MISFET can be formed.

Also, although the semiconductor element formed in the chip area 1A has been described here by taking for example, the MISFET, a capacitive element, a resistive element, a memory element or transistors having other configurations, etc. can also be formed in addition to the above. Further, although the semiconductor element formed in the chip area 1A has been described here by taking for example, the MISFET, the capacitive element, the resistive element, the memory element or the transistors of other configurations may be formed in the chip area 1A.

Next, a multilayer wiring structure comprised of a plurality of interlayer insulating films (IL1 through IL5) and a plurality of wiring layers (M1 through M5) is formed over the semiconductor substrate SB. This will hereinafter be described specifically.

Figure 9:
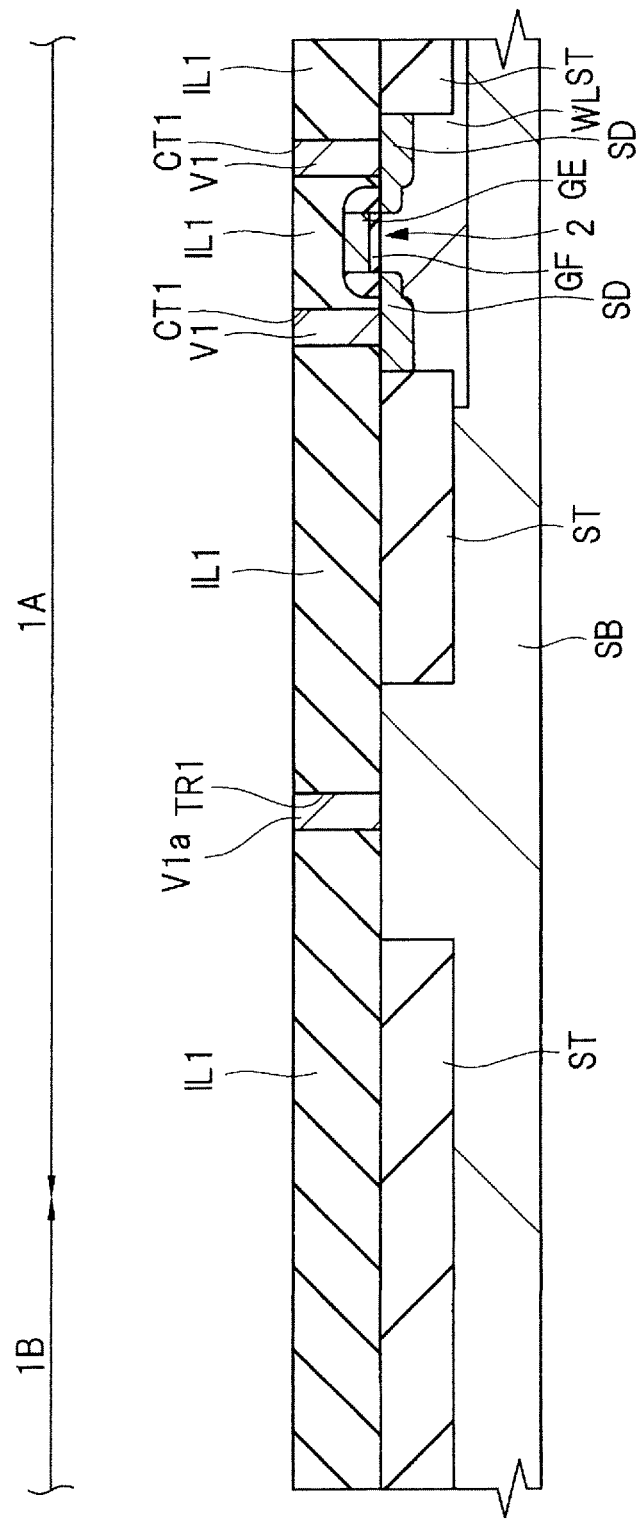
FIG. 9 is a fragmentary sectional view following FIG. 8 in the manufacturing process of the semiconductor device.

First, as shown in FIG. 9, an interlayer insulting film IL1 is formed over the main surface (whole main surface) of the semiconductor substrate SB. The interlayer insulating film IL1 is formed so as to cover elements (such as MISFET 2, etc.) formed in the semiconductor substrate SB. The interlayer insulating film IL1 is formed in the chip area 1A and the scribe area 1B because it is formed over the whole main surface of the semiconductor substrate SB. The interlayer insulating film IL1 is comprised of, for example, a single film of a silicon oxide film or a laminated film of a silicon nitride film and a silicon oxide film formed over the silicon nitride film and thicker than the silicon nitride film, etc.

After forming the interlayer insulating film IL1, the upper surface of the interlayer insulating film IL1 is planarized by performing as needed, polishing of the surface (upper surface) of the interlayer insulating film IL1 by a CMP (Chemical Mechanical Polishing) method, etc. Even if concave/convex shapes are formed in the surface of the interlayer insulating film IL1 due to underlying steps, the interlayer insulating film IL1 whose surface is planarized can be obtained by polishing the surface of the interlayer insulating film IL1 by the CMP method.

Next, the interlayer insulating film IL1 is dry etched using a photoresist layer (not shown) formed over the interlayer insulating film IL1 using a photolithography technique, as an etching mask to thereby form in the interlayer insulating film IL1, a contact hole (through hole, hole) CT1 for embedding the via portion V1, and a trench TR1 for embedding the sealring via portion V1. The contact hole CT1 and the trench TR1 are formed so as to penetrate the interlayer insulating film IL1. Then, a conductive film is embedded into the contact hole CT1 and the trench TR1 to thereby form the via portion V1 in the contact hole CT1 and form the sealring via portion V1a in the trench TR1.

In order to form the via portion V1 and the sealring via portion V1a, for example, a barrier conductor film (e.g., titanium film, titanium nitride film or laminated film of these) is formed over the interlayer insulating film IL1 including the inside (bottom and over side walls) of each of the contact hole CT1 and the trench TR1 by a sputtering method or a plasma CVD method or the like. Then, a main conductor film comprised of a tungsten film or the like is formed over the barrier conductor film by a CVD method or the like so as to embed the contact hole CT1 and the trench TR1. Thereafter, the main conductor film and barrier conductor film unnecessary outside (over the interlayer insulating film IL1) the contact hole CT1 and the groove TR1 are removed by a CMP method or an etchback method or the like. Thus, the upper surface of the interlayer insulating film IL1 is exposed so that the via portion V1 is formed by the barrier conductor film and the main conductor film both of which are embedded in the contact hole CT1 of the interlayer insulating film IL1 and remain, and the sealring via portion V1a is formed by the barrier conductor film and the main conductor film both of which are embedded in the trench TR1 of the interlayer insulating film IL1 and remain. In FIG. 9, for simplification of the drawing, the via portion V1 and the sealring via portion V1a are shown with the main conductor film and the barrier conductor film being integrated together.

Figure 10:
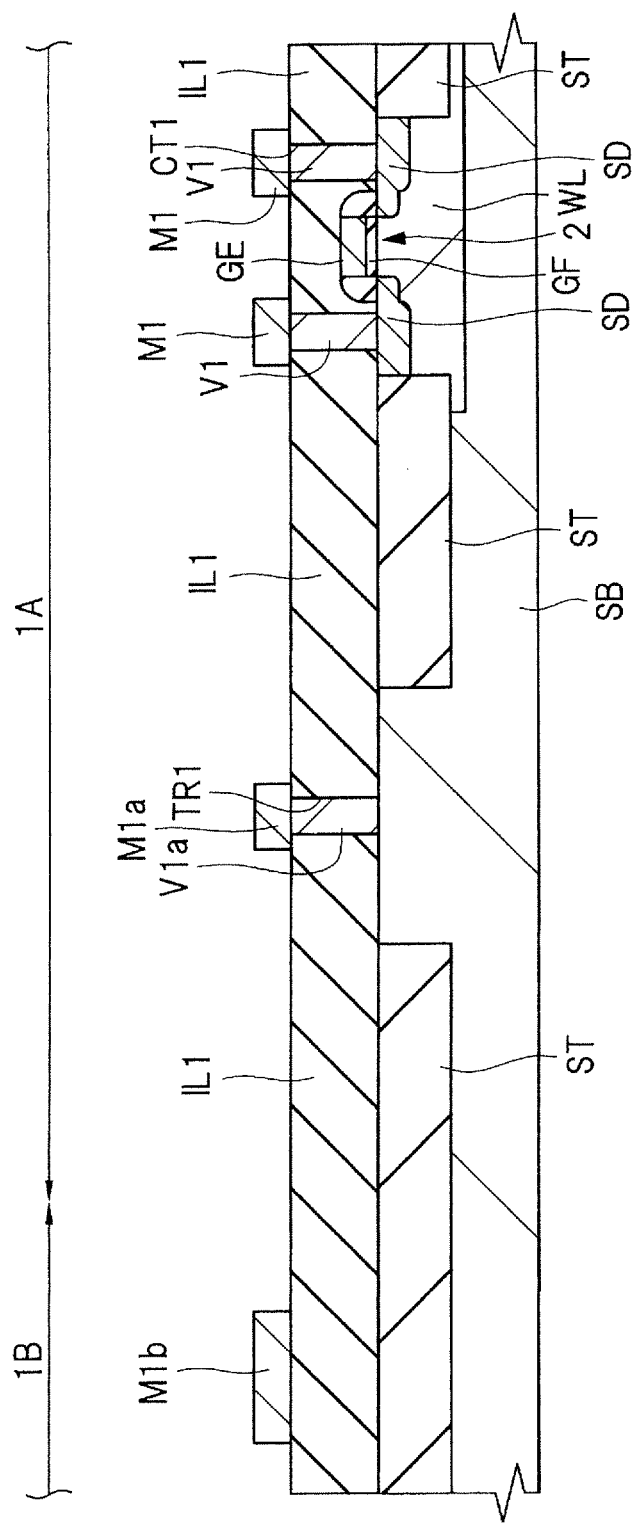
FIG. 10 is a fragmentary sectional view following FIG. 9 in the manufacturing process of the semiconductor device.

Next, as shown in FIG. 10, a wiring M1 of a first wiring layer corresponding to a wiring layer at the uppermost layer is formed over the interlayer insulating film IL1 embedded with the via portion V1 and the sealring via portion V1a. Upon forming the wiring M1, a sealring wiring M1a is also formed together. In order to form the wirings M1 and M1a, a conductive film for the first wiring layer is first formed over the interlayer insulating film IL1 embedded with the via portions V1 and V1a. This conductive film is comprised of, for example, a laminated film of a barrier conductor film, an aluminum film and a barrier conductor film in that order from the bottom and can be formed using the sputtering method or the like. As the barrier conductor film used in the conductive film for the first wiring layer, for example, a titanium film, a titanium nitride film or a laminated film of these can be illustrated by an example, but this can be applied even to a barrier conductor film in each of conductive films for second through fifth wiring layers formed later. Further, the aluminum film used in the conductive film for the first wiring layer is not limited to a pure aluminum film, but may contain a conductive material film (which is however a conductive material film showing metallic conductivity) comprised principally of aluminum. This is however applicable even to the aluminum film in each of the conductive films for the second through fifth wiring layers formed later. Then, the conductive film for the first wiring layer is patterned using the photolithography technique and the etching technique to thereby make it possible to form the wiring M1 and the sealring wiring M1a. The via portion V1 is electrically coupled to the wiring M1 by allowing its upper surface to contact the wiring M1. The sealring wiring M1a is formed at a position where it overlaps with the sealring via portion V1a in plan view, and coupled to the sealring via portion V1a.

Also, a description has been made here about the case where the wirings M1 and M1a are formed by the method of patterning the conductive film. As another form, the wiring M1 and the sealring wiring M1a can also be formed by a damascene method. In this case, after an insulating film is formed over the interlayer insulating film IL1 embedded with the via portions V1 and V1a, a groove (wiring groove) is formed in the insulating film, and a conductive film is embedded in the groove, so that the wiring M1 and the sealring wiring M1a can be formed. In this case, the wiring M1 is comprised of an embedded wiring (e.g., embedded copper wiring).

Further, although the wiring M1 and the sealring wiring M1a are formed in the chip area 1A, a metal pattern M1b of the same layer as the wirings M1 and M1a can also be formed in the scribe area 1B upon forming these wirings M1 and M1a. It is possible to form not only the wirings M1 and M1a of the chip area 1A, but also the metal pattern M1b of the scribe area 1B by patterning the conductive film for the first wiring layer, for example. The metal pattern M1b of the scribe area 1B can be used as, for example, an alignment mark or a test pattern or the like.

Figure 11:
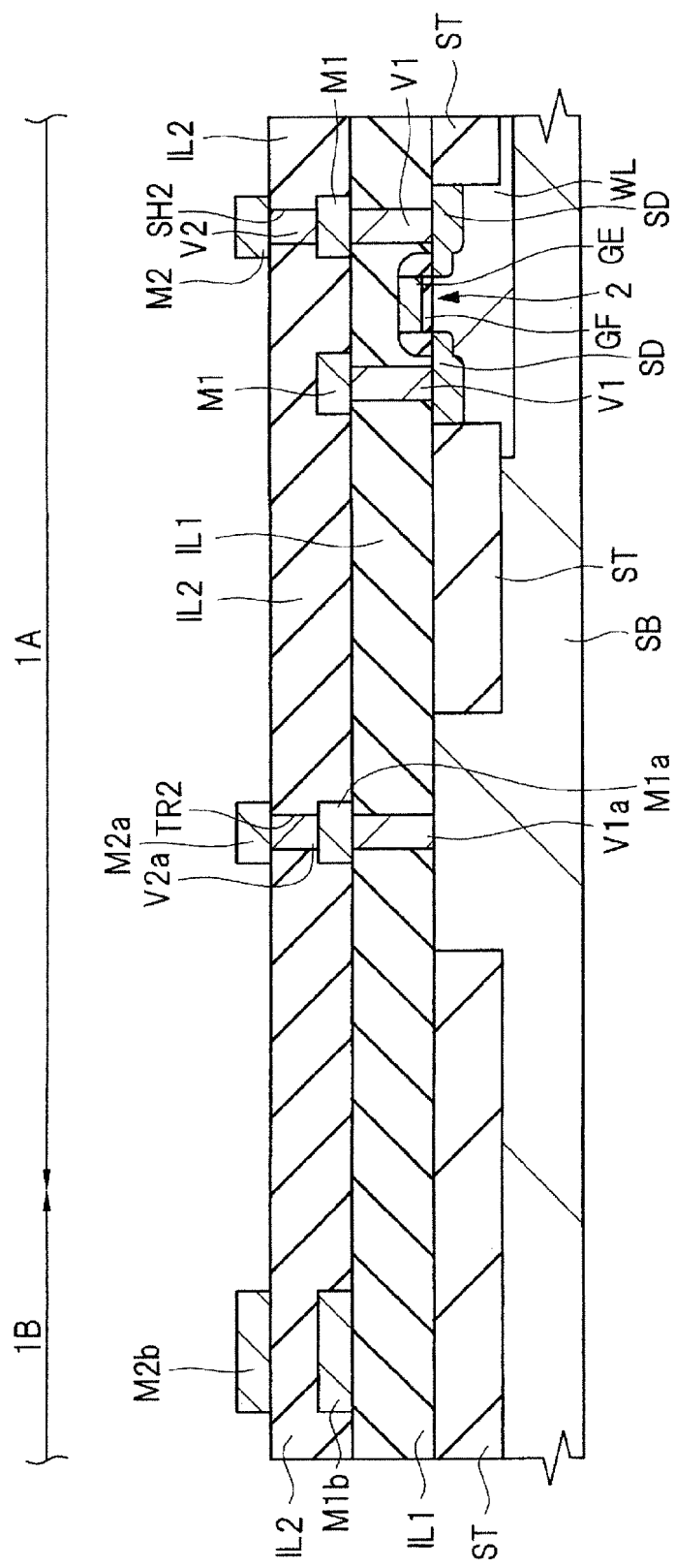
FIG. 11 is a fragmentary sectional view following FIG. 10 in the manufacturing process of the semiconductor device.

Next, as shown in FIG. 11, an interlayer insulating film IL2 is formed over the main surface (whole main surface) of the semiconductor substrate SB, i.e., the interlayer insulating film IL1 so as to cover the wiring M1 and the sealring wiring M1a. The interlayer insulating film IL2 is comprised of, for example, a silicon oxide film or the like and can be formed using the CVD method or the like. After the formation of the interlayer insulating film IL2, the flatness of the upper surface of the interlayer insulating film IL2 can also be enhanced by performing as needed, polishing of the surface (upper surface) of the interlayer insulating film IL2 by the CMP method, etc.

Next, the interlayer insulating film IL2 is dry etched using as an etching mask, a photoresist layer (not shown) formed over the interlayer insulating film IL2 using the photolithography technique to thereby form in the interlayer insulating film IL2, a through hole (penetration hole, hole) SH2 for embedding a via portion V2 and a trench TR2 for embedding a sealring via portion V2a. Then, a conductive film is embedded into the through hole SH2 and the trench TR2 to thereby form the via portion V2 in the through hole SH2 and form the sealring via portion V2a in the trench TR2. The via portion V2 can also be assumed to be a conductive plug. The sealring via portion V2a is formed at a position where it overlaps with the sealring wiring M1a in plan view.

The via portion V2 and the sealring via portion V2a can be formed by a method similar to that for the via portion V1 and the sealring via portion V1a. Further, the via portion V2 and the sealring via portion V2a can be made identical in conductive material to the via portion V1 and the sealring via portion V1a, but can be made different from each other. For example, the via portion V1 and the sealring via portion V1a can be comprised mainly of a tungsten film, and the via portion V2 and the sealring via portion V2a can also be comprised mainly of an aluminum film.

Next, a wiring M2 of a second wiring layer is formed over the interlayer insulating film IL2 embedded with the via portions V2 and V2a. Upon forming the wiring M2, a sealring wiring M2a is also formed together. In order to form the wirings M2 and M2a, a conductive film for the second wiring layer is first formed over the interlayer insulating film IL2 embedded with the via portions V2 and V2a. This conductive film is comprised of, for example, a laminated film of a barrier conductor film, an aluminum film and a barrier conductor film in that order from the bottom and can be formed using the sputtering method or the like. Then, the conductive film for the second wiring layer is patterned using the photolithography technique and the etching technique to thereby make it possible to form the wiring M2 and the sealring wiring M2a. The via portion V2 is electrically coupled to the wiring M1 by allowing its lower surface to contact the wiring M1 and is electrically coupled to the wiring M2 by allowing its upper surface to contact the wiring M2. That is, the via portion V2 electrically couples the wiring M1 and the wiring M2. The sealring wiring M2a is formed at a position where it overlaps with the sealring via portion V2a in plan view.

Also, a description has been made here about the case where the via portion V2 and the wiring M2 are formed in the separate processes. As another form, the via portion V2 and the wiring M2 can also be formed in the same process. In this case, the via portion V2 is formed integrally with the wiring M2. Further, the sealring via portion V2a is formed integrally with the sealring wiring M2a. In this case, after the through hole SH2 for the via portion V2 and the trench TR2 for the via portion V2a are formed in the interlayer insulating film IL2, a conductive film for the second wiring layer is formed over the interlayer insulating film IL2 so as to embed the through hole SH2 and the trench TR2. Then, the conductive film is patterned using the photolithography technique and the etching technique to thereby form the wiring M2 and the sealring wiring M2a. Thus, the wiring M2 and the sealring wiring M2a are formed, and the via portion V2 formed integrally with the wiring M2 and the sealring via portion V2a formed integrally with the sealring wiring M2a are also formed.

Further, a description has been made here about the case where the wiring M2 and the sealring wiring M2a are formed by the method of patterning the conductive film. As another form, the wiring M2 and the sealring wiring M2a can also be formed by a damascene method (single damascene method or dual damascene method).

Furthermore, the wiring M2 and the sealring wiring M2a are formed in the chip area 1A, but a metal pattern M2b of the same layer as the wirings M2 and M2a can also be formed in the scribe area 1B upon forming these wirings M2 and M2a. It is possible to form not only the wirings M2 and M2a of the chip area 1A, but also the metal pattern M2b of the scribe area 1B by patterning the conductive film for the second wiring layer, for example. The metal pattern M2b of the scribe area 1B can be used as, for example, an alignment mark or a test pattern or the like.

Figure 12:
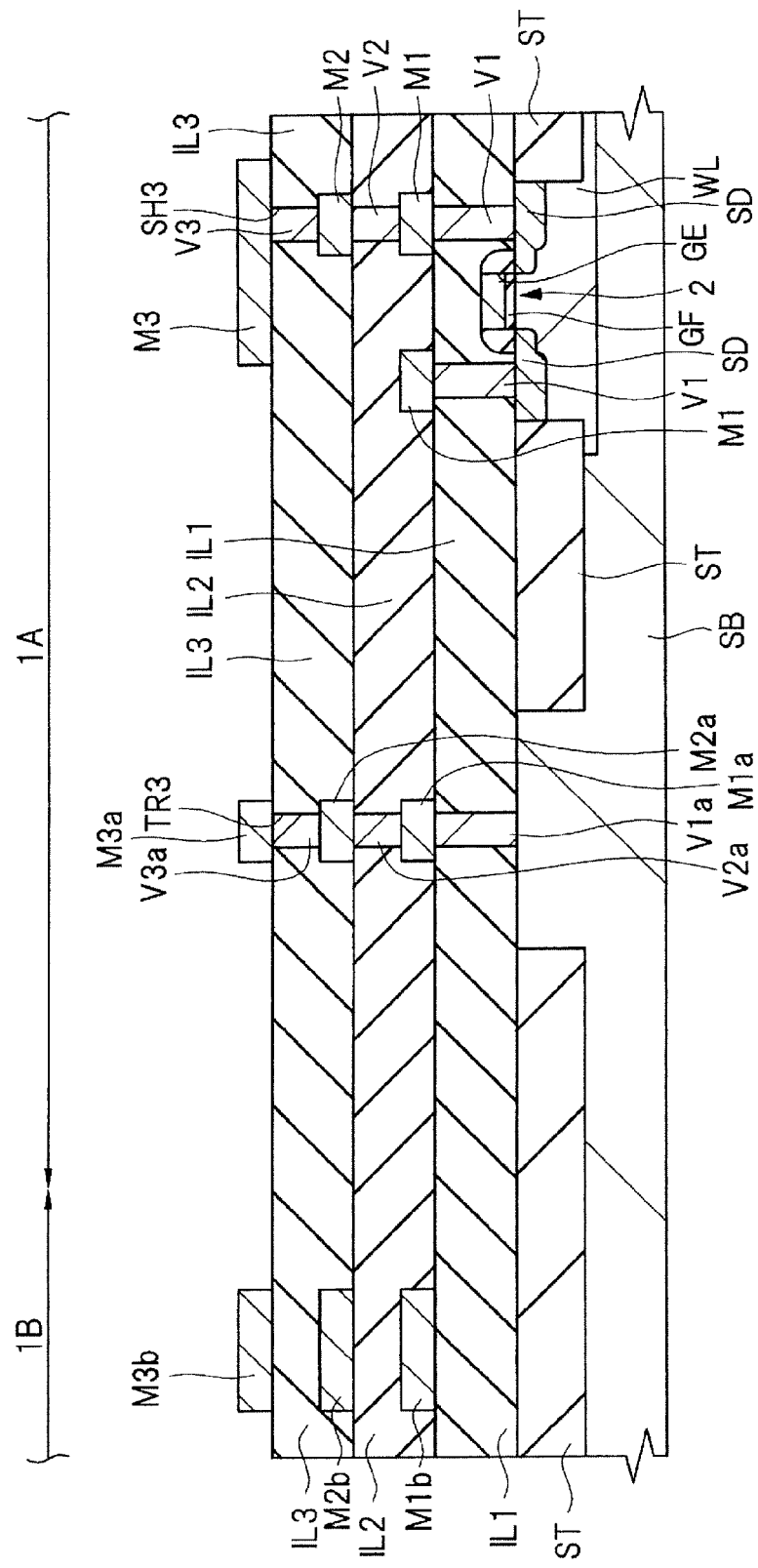
FIG. 12 is a fragmentary sectional view following FIG. 11 in the manufacturing process of the semiconductor device.

Next, as shown in FIG. 12, an interlayer insulating film IL3 is formed over the main surface (whole main surface) of the semiconductor substrate SB, i.e., the interlayer insulating film IL2 so as to cover the wiring M2 and the sealring wiring M2a. The interlayer insulating film IL3 is comprised of, for example, a silicon oxide film or the like and can be formed using the CVD method or the like. After the formation of the interlayer insulating film IL3, the flatness of the upper surface of the interlayer insulating film IL3 can also be enhanced by performing as needed, polishing of the surface (upper surface) of the interlayer insulating film IL2 by the CMP method, etc.

Next, the interlayer insulating film IL3 is dry etched using as an etching mask, a photoresist layer (not shown) formed over the interlayer insulating film IL3 using the photolithography technique to thereby form in the interlayer insulating film IL3, a through hole (penetration hole, hole) SH3 for embedding a via portion V3 and a trench TR3 for embedding a sealring via portion V3a. Then, a conductive film is embedded into the through hole SH3 and the trench TR3 to thereby form the via portion V3 in the through hole SH3 and form the sealring via portion V3a in the trench TR3. The via portion V3 and the sealring via portion V3a can be formed of a conductive material similar to that for the via portion V2 and the sealring via portion V2a by a method similar thereto. The via portion V3 can also be assumed to be a conductive plug. The sealring via portion V3a is formed at a position where it overlaps with the sealring wiring M2a in plan view.

Next, a wiring M3 of a third wiring layer is formed over the interlayer insulating film IL3 embedded with the via portions V3 and V3a. Upon forming the wiring M3, a sealring wiring M3a is also formed together. In order to form the wirings M3 and M3a, a conductive film for the third wiring layer is first formed over the interlayer insulating film IL3 embedded with the via portions V3 and V3a. This conductive film is comprised of, for example, a laminated film of a barrier conductor film, an aluminum film and a barrier conductor film in that order from the bottom and can be formed using the sputtering method or the like. Then, the conductive film for the third wiring layer is patterned using the photolithography technique and the etching technique to thereby make it possible to form the wiring M3 and the sealring wiring M3a. The via portion V3 is electrically coupled to the wiring M2 by allowing its lower surface to contact the wiring M2 and is electrically coupled to the wiring M3 by allowing its upper surface to contact the wiring M3. That is, the via portion V3 electrically couples the wiring M2 and the wiring M3. The sealring wiring M3a is formed at a position where it overlaps with the sealring via portion V3a in plan view.

Also, a description has been made here about the case where the via portion V3 and the wiring M3 are formed in the separate processes. As another form, the via portion V3 and the wiring M3 can also be formed in the same process. In this case, the via portion V3 is formed integrally with the wiring M3. Further, the sealring via portion V3a is formed integrally with the sealring wiring M3a.

Further, a description has been made here about the case where the wiring M3 and the sealring wiring M3a are formed by the method of patterning the conductive film. As another form, the wiring M3 and the sealring wiring M3a can also be formed by the damascene method (single damascene method or dual damascene method).

Furthermore, the wiring M3 and the sealring wiring M3a are formed in the chip area 1A, but a metal pattern M3b of the same layer as the wirings M3 and M3a can also be formed in the scribe area 1B upon forming these wirings M3 and M3a. It is possible to form not only the wirings M3 and M3a of the chip area 1A, but also the metal pattern M3b of the scribe area 1B by patterning the conductive film for the third wiring layer, for example. The metal pattern M3b of the scribe area 1B can be used as, for example, an alignment mark or a test pattern or the like.

Figure 13:
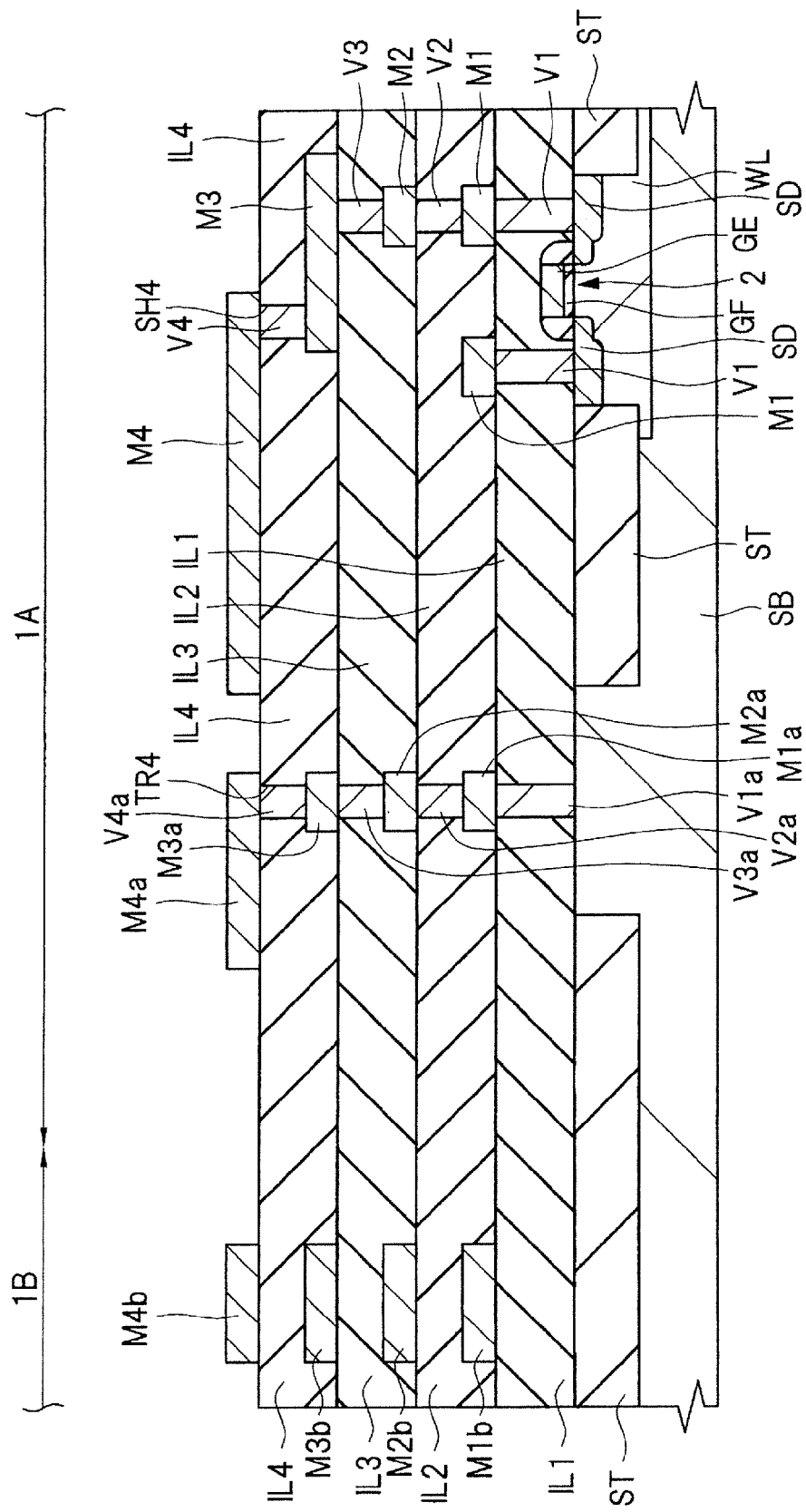
FIG. 13 is a fragmentary sectional view following FIG. 12 in the manufacturing process of the semiconductor device.

Next, as shown in FIG. 13, an interlayer insulating film IL4 is formed over the main surface (whole main surface) of the semiconductor substrate SB, i.e., the interlayer insulating film IL3 so as to cover the wiring M3 and the sealring wiring M3a. The interlayer insulating film IL4 is comprised of, for example, a silicon oxide film or the like and can be formed using the CVD method or the like. After the formation of the interlayer insulating film IL4, the flatness of the upper surface of the interlayer insulating film IL4 can also be enhanced by performing as needed, polishing of the surface (upper surface) of the interlayer insulating film IL4 by the CMP method, etc.

Next, the interlayer insulating film IL4 is dry etched using as an etching mask, a photoresist layer (not shown) formed over the interlayer insulating film IL4 using the photolithography technique to thereby form in the interlayer insulating film IL4, a through hole (penetration hole, hole) SH4 for embedding a via portion V4 and a trench TR4 for embedding a sealring via portion V4a. Then, a conductive film is embedded into the through hole SH4 and the trench TR4 to thereby form the via portion V4 in the through hole SH4 and form the sealring via portion V4a in the trench TR4. The via portion V4 and the sealring via portion V4a can be formed of a conductive material similar to that for the via portion V3 and the sealring via portion V3a by a method similar thereto. The via portion V4 can also be assumed to be a conductive plug. The sealring via portion V4a is formed at a position where it overlaps with the sealring wiring M3a in plan view.

Next, a wiring M4 of a fourth wiring layer is formed over the interlayer insulating film IL4 embedded with the via portions V4 and V4a. Upon forming the wiring M4, a sealring wiring M4a is also formed together. In order to form the wirings M4 and M4a, a conductive film for the fourth wiring layer is first formed over the interlayer insulating film IL4 embedded with the via portions V4 and V4a. This conductive film is comprised of, for example, a laminated film of a barrier conductor film, an aluminum film and a barrier conductor film in that order from the bottom and can be formed using the sputtering method or the like. Then, the conductive film for the fourth wiring layer is patterned using the photolithography technique and the etching technique to thereby make it possible to form the wiring M4 and the sealring wiring M4a. The via portion V4 is electrically coupled to the wiring M3 by allowing its lower surface to contact the wiring M3 and is electrically coupled to the wiring M4 by allowing its upper surface to contact the wiring M4. That is, the via portion V4 electrically couples the wiring M3 and the wiring M4. The sealring wiring M4a is formed at a position where it overlaps with the sealring via portion V4a in plan view.

Also, a description has been made here about the case where the via portion V4 and the wiring M4 are formed in the separate processes. As another form, the via portion V4 and the wiring M4 can also be formed in the same process. In this case, the via portion V4 is formed integrally with the wiring M4. Further, the sealring via portion V4a is formed integrally with the sealring wiring M4a.

Further, a description has been made here about the case where the wiring M4 and the sealring wiring M4a are formed by the method of patterning the conductive film. As another form, the wiring M4 and the sealring wiring M4a can also be formed by the damascene method (single damascene method or dual damascene method).

Furthermore, the wiring M4 and the sealring wiring M4a are formed in the chip area 1A, but a metal pattern M4b of the same layer as the wirings M4 and M4a can also be formed in the scribe area 1B upon forming these wirings M4 and M4a. It is possible to form not only the wirings M4 and M4a of the chip area 1A, but also the metal pattern M4b of the scribe area 1B by patterning the conductive film for the fourth wiring layer, for example. The metal pattern M4b of the scribe area 1B can be used as, for example, an alignment mark or a test pattern or the like.

Figure 14:
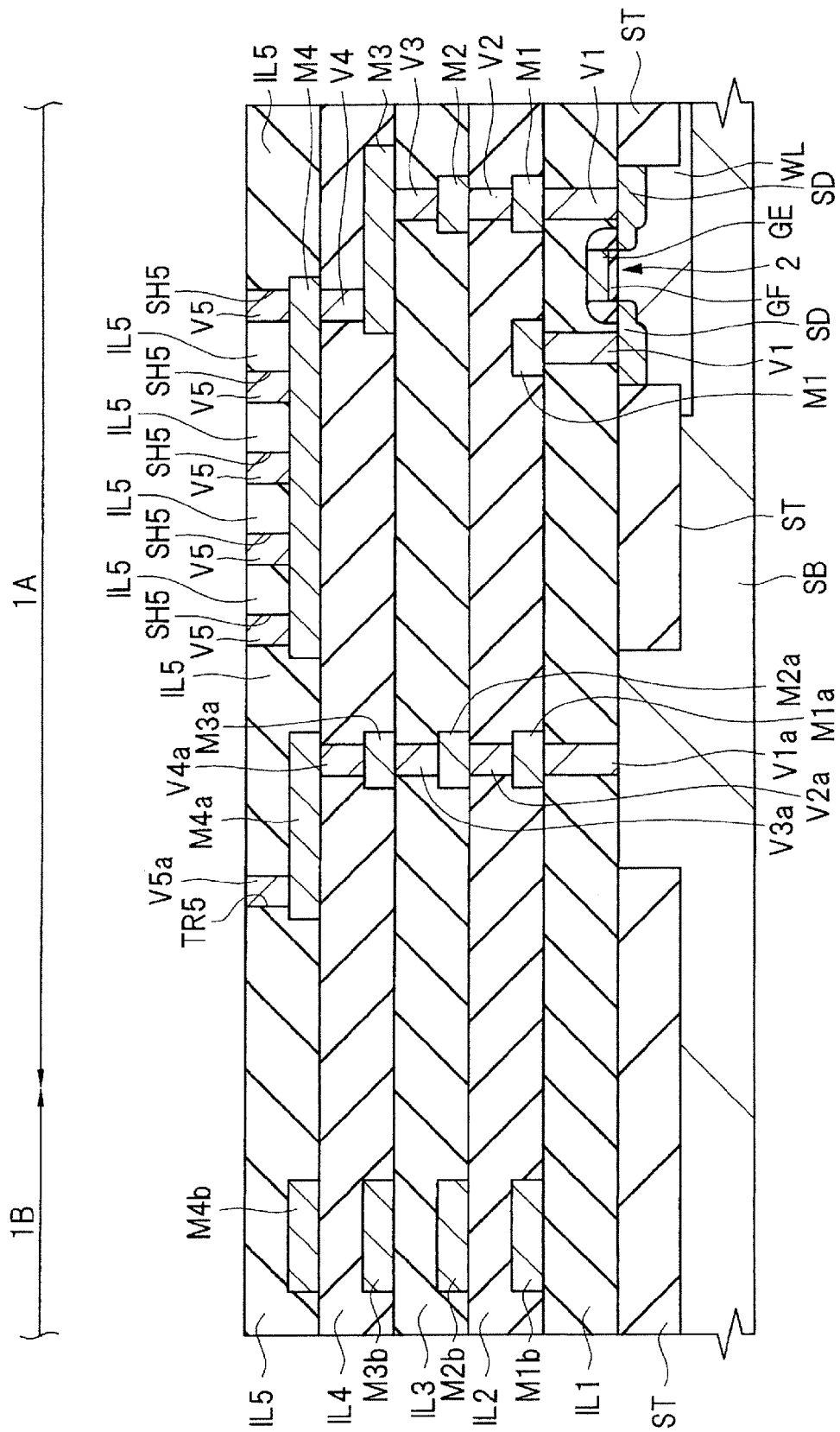
FIG. 14 is a fragmentary sectional view following FIG. 13 in the manufacturing process of the semiconductor device.
Figure 15:
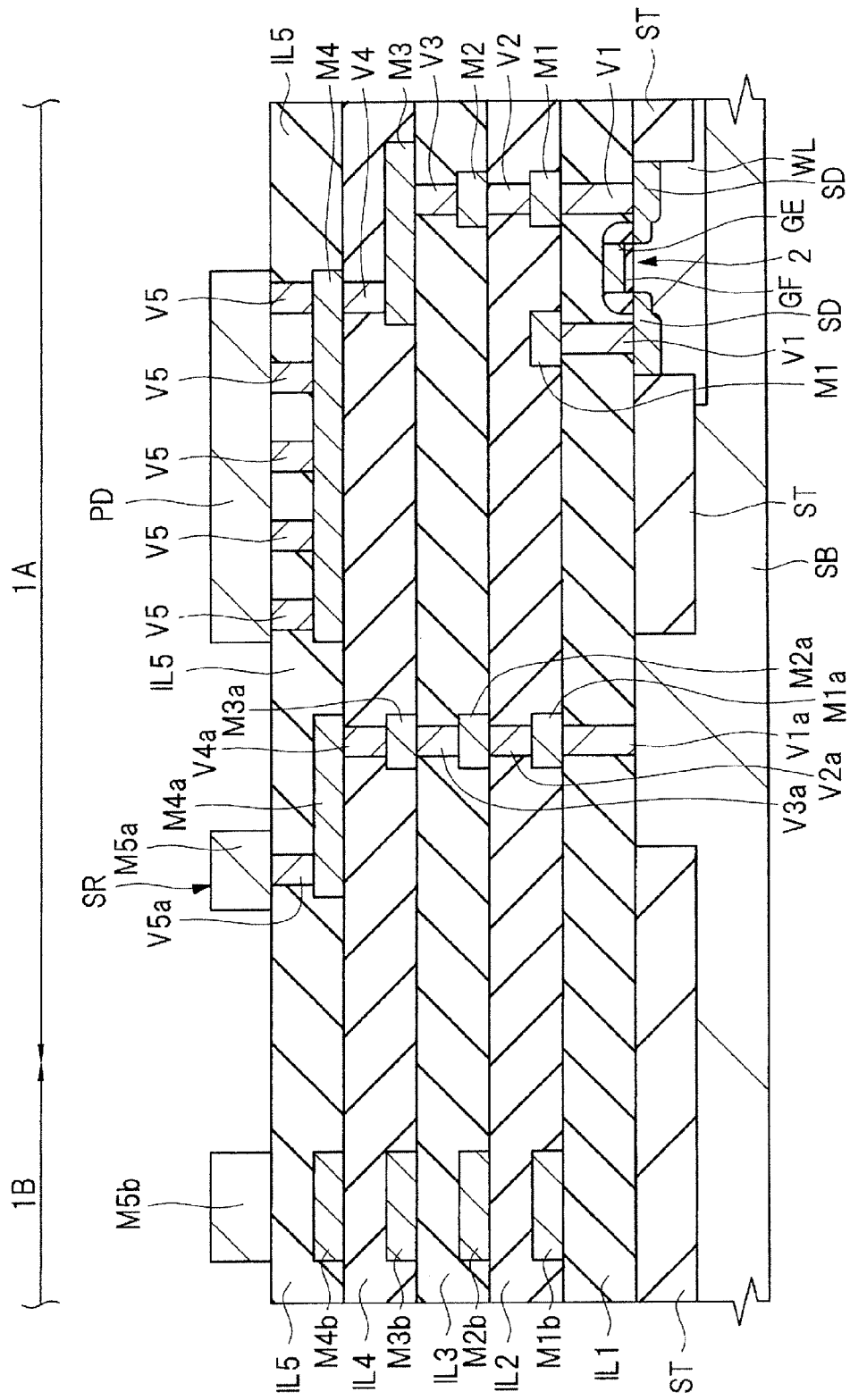
FIG. 15 is a fragmentary sectional view following FIG. 14 in the manufacturing process of the semiconductor device.

Next, as shown in FIG. 14, an interlayer insulating film IL5 is formed over the main surface (whole main surface) of the semiconductor substrate SB, i.e., the interlayer insulating film IL4 so as to cover the wiring M4 and the sealring wiring M4a. The interlayer insulating film IL5 is comprised of, for example, a silicon oxide film or the like and can be formed using the CVD method or the like. After the formation of the interlayer insulating film IL5, the flatness of the upper surface of the interlayer insulating film IL5 can also be enhanced by performing as needed, polishing of the surface (upper surface) of the interlayer insulating film IL5 by the CMP method, etc.

Next, the interlayer insulating film IL5 is dry etched using as an etching mask, a photoresist layer (not shown) formed over the interlayer insulating film IL5 using the photolithography technique to thereby form in the interlayer insulating film IL5, a through hole (penetration hole, hole) SH5 for embedding a via portion V5 and a trench TR5 for embedding a sealring via portion V5a. Then, a conductive film is embedded into the through hole SH5 and the trench TR5 to thereby form the via portion V5 in the through hole SH5 and form the sealring via portion V5a in the trench TR5. The via portion V5 and the sealring via portion V5a can be formed of a conductive material similar to that for the via portion V4 and the sealring via portion V4a by a method similar thereto. The via portion V5 can also be assumed to be a conductive plug. The sealring via portion V5a is formed at a position where it overlaps with the sealring wiring M4a in plan view.

Next, a wiring M5 of a fifth wiring layer and a pad PD are formed over the interlayer insulating film IL4 embedded with the via portions V4 and V4a. Upon forming the wiring M5 and the pad PD, a sealring wiring M5a is also formed together. In order to form the wirings M5 and M5a and the pad PD, a conductive film for the fifth wiring layer is first formed over the interlayer insulating film IL5 embedded with the via portions V5 and V5a. This conductive film is comprised of, for example, a laminated film of a barrier conductor film, an aluminum film and a barrier conductor film in that order from the bottom and can be formed using the sputtering method or the like. Then, the conductive film for the fifth wiring layer is patterned using the photolithography technique and the etching technique to thereby make it possible to form the wiring M5 and the pad PD, and the sealring wiring M5a. The via portion V5 is electrically coupled to the wiring M4 by allowing its lower surface to contact the wiring M4 and is electrically coupled to the wiring M5 or the pad PD by allowing its upper surface to contact the wiring M5 or the pad PD. That is, the via portion V5 electrically couples the wiring M4 and the wiring M5 or electrically couples the wiring M4 and the pad PD. The sealring wiring M5a is formed at a position where it overlaps with the sealring via portion V5a in plan view. A planar shape of the pad PD can be taken to be, for example, a substantially rectangular planar shape having a side larger than a wiring width of the wiring M5. A sealring SR is formed in the outer peripheral part of the chip area 1A by the sealring wirings M5a, M4a, M3a, M2a, and M1a, and the sealring via portions V5a, V4a, V3a, V2a, and V1a.

Also, a description has been made here about the case where the via portion V5 and the wiring M5 are formed in the separate processes. As another form, the via portion V5 and the wiring M5 can also be formed in the same process. In this case, the via portion V5 is formed integrally with the wiring M5 or the pad PD. Further, the sealring via portion V5a is formed integrally with the sealring wiring M5a. In this case, after the through hole SH5 and the trench TR5 are formed in the interlayer insulating film IL5, a conductive film for the fifth wiring layer is formed over the interlayer insulating film IL5 so as to embed the through hole SH5 and the trench TR5. Then, the conductive film is patterned using the photolithography technique and the etching technique to thereby form the wiring M5 and the pad PD, and the sealring wiring M5a. Thus, the wiring M5 and the pad PD, and the sealring wiring M5a are formed, and the via portion V5 formed integrally with the wiring M5 or the pad PD, and the sealring via portion V5a formed integrally with the sealring wiring M5a are also formed.

Furthermore, the wiring M5 and the sealring wiring M5a are formed in the chip area 1A, but a metal pattern M5b of the same layer as the wirings M5 and M5a can also be formed in the scribe area 1B upon forming these wirings M5 and M5a. It is possible to form not only the wirings M5 and M5a of the chip area 1A, but also the metal pattern M5b of the scribe area 1B by patterning the conductive film for the fifth wiring layer, for example. The metal pattern M5b of the scribe area 1B can be used as, for example, an alignment mark or a test pattern or the like.

Figure 16:
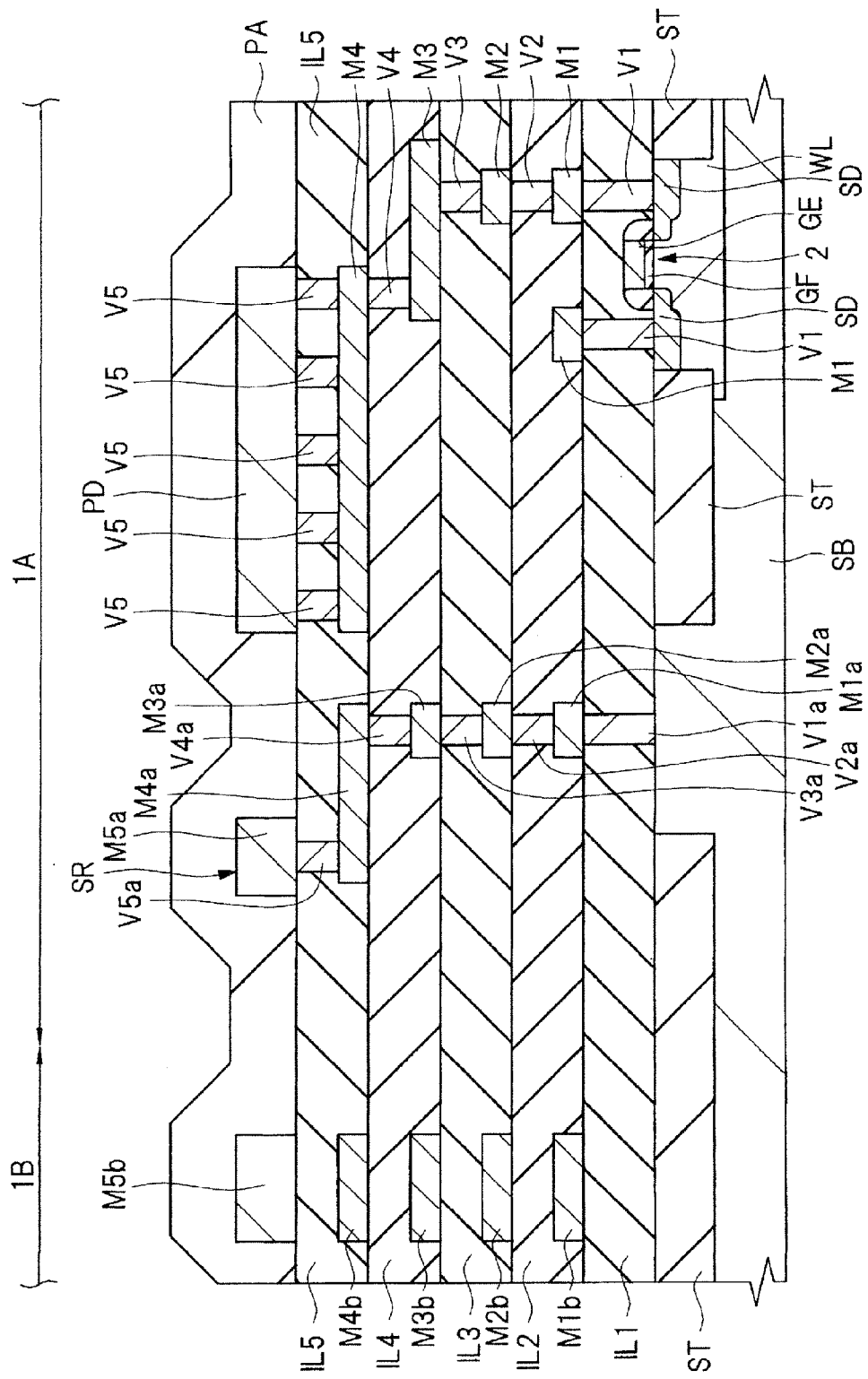
FIG. 16 is a fragmentary sectional view following FIG. 15 in the manufacturing process of the semiconductor device.

Next, as shown in FIG. 16, an insulating film PA is formed over the main surface (whole main surface) of the semiconductor substrate SB, i.e., the interlayer insulating film IL5 so as to cover the wiring M5, the pad PD, and the sealring wiring M5a. The insulating film PA is comprised of, for example, a silicon oxide film or the like and can be formed using the CVD method or the like. At this stage, the insulating film PA is formed over the whole chip area 1A and the whole scribe area 1B.

Figure 17:
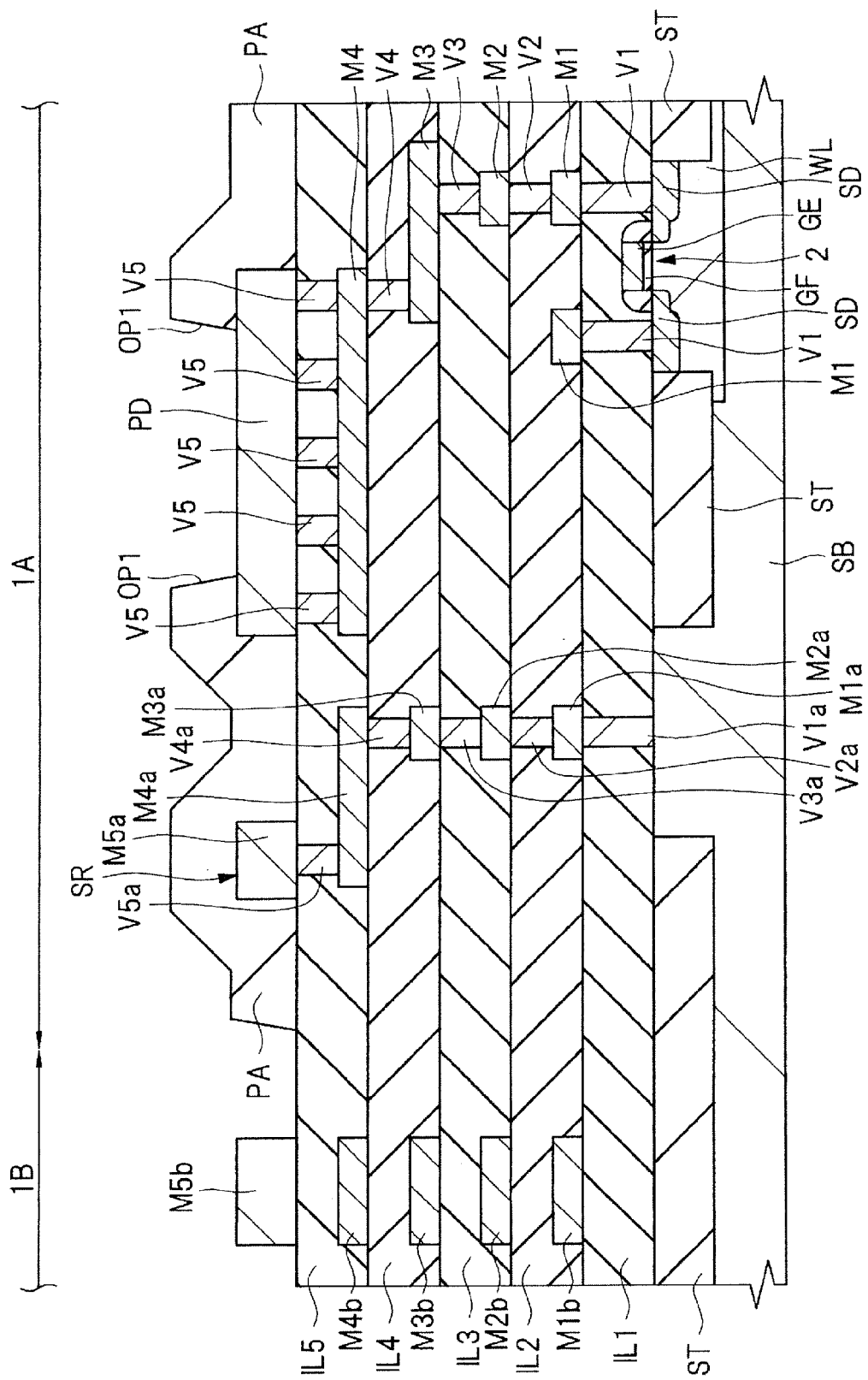
FIG. 17 is a fragmentary sectional view following FIG. 16 in the manufacturing process of the semiconductor device.

Next, as shown in FIG. 17, an opening OP1 is formed in the insulating film PA. The opening OP1 is formed by selectively removing the insulating film PA lying over the pad PD. The opening OP1 is formed so as to be included in the pad PD in plan view. The surface of the pad PD is exposed from the opening OP1 of the insulating film PA.

The opening OP1 can be formed in the following manner, for example. That is, after forming the insulating film PA, a photoresist layer (not shown) is formed over the insulating film PA using the photolithography technique. Then, the insulating film PA is etched (dry etched) using the photoresist layer as an etching mask to thereby form the opening OP1 in the insulating film PA. At this time, it is preferable that the insulating film PA of the scribe area 1B is exposed without being covered with the photoresist layer, and in the etching process for forming the opening OP1, the insulating film PA of the scribe area 1B is also removed by etching. Thereafter, the photoresist layer is removed.

Figure 18:
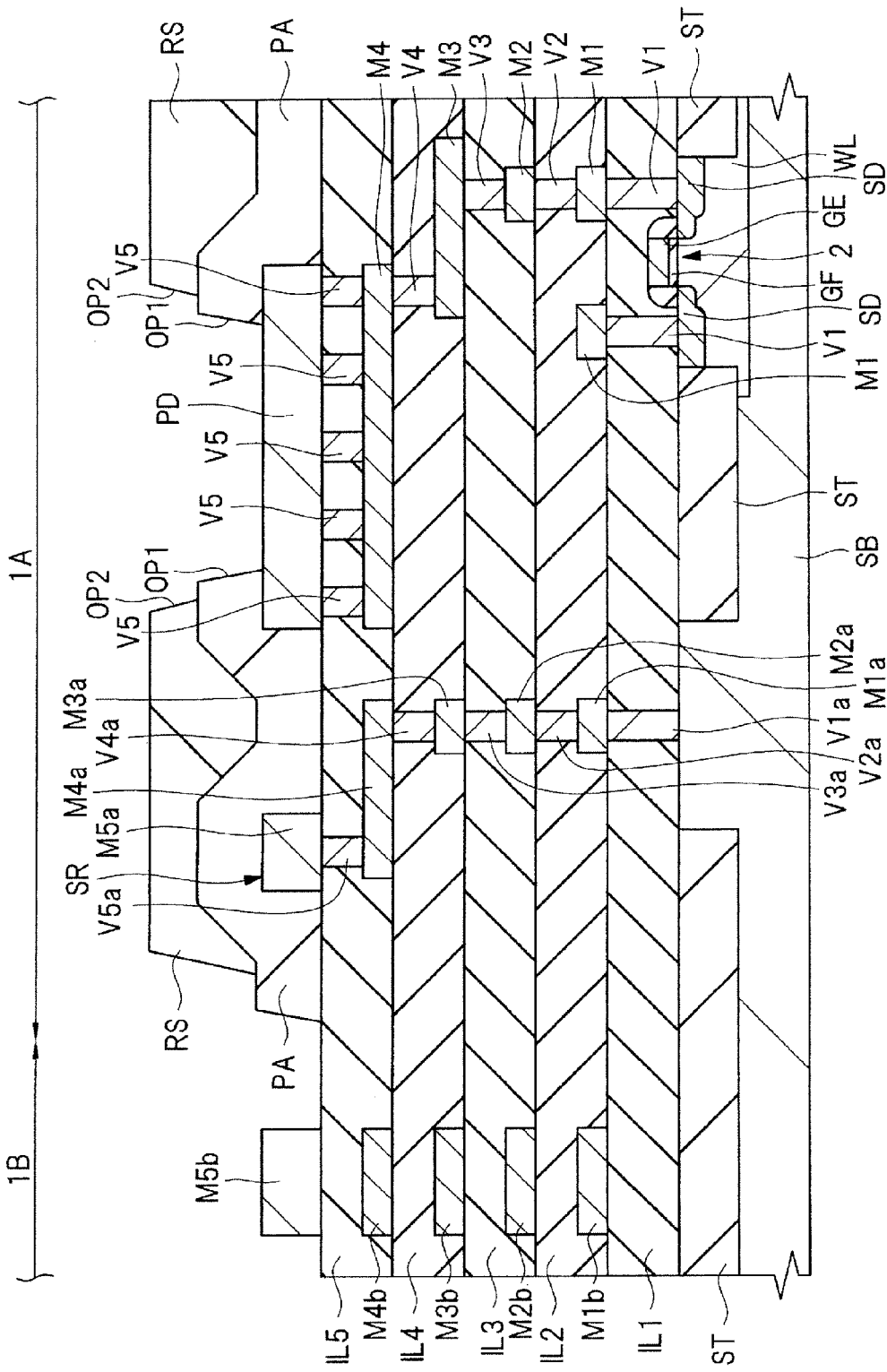
FIG. 18 is a fragmentary sectional view following FIG. 17 in the manufacturing process of the semiconductor device.

Next, as shown in FIG. 18, an insulating film RS is formed over the main surface (whole main surface) of the semiconductor substrate SB, i.e., the insulating film PA. The insulating film RS is comprised of, for example, a resin film such as a polyimide film. At this stage, the insulating film RS is formed over the whole chip area 1A and the whole scribe area 1B. Since the insulating film PA is removed in the scribe area 1B, the insulating film RS is formed over the interlayer insulating film IL5.

Next, an opening OP2 is formed in the insulating film RS. The opening OP2 is formed by selectively removing the insulating film RS lying over the pad PD. The opening OP2 of the insulating film RS is formed so as to include the opening OP1 of the insulating film PA in plan view.

The opening OP2 can be formed in the following manner, for example. That is, an insulating film RS is formed as a photosensitive resin film, and a photoresist layer (not shown) is formed over the insulating film RS comprised of a photosensitive resin by using the photolithography technique. Then, the insulating film RS comprised of the photosensitive resin is exposed using the photoresist layer as a mask. Thus, the insulating film RS of the portion exposed without being covered with the photoresist layer is exposed. Thereafter, the photoresist layer is removed and then the insulating film RS comprised of the photosensitive resin is subjected to development processing, thereby removing an exposed portion in the insulating film RS. By this exposure and development processing, the insulating film RS of the portion as the opening OP2 is selectively removed to thereby enable the opening OP2 to be formed in the insulating film RS. At this time, the insulating film RS of the scribe area 1B is preferably removed by the exposure and development processing. That is, not only the insluting film RS corresponding to a scheduled region formed with the opening OP2, but also the insulating film RS of the scribe area 1B are exposed without being covered with the photoresist layer. In an exposure process, not only the insluting film RS corresponding to the scheduled region formed with the opening OP2, but also the insulating film RS of the scribe area 1B are exposed, followed by execution of development processing thereof. Thus, the opening OP2 is formed in the insulating film RS, and the insulating film RS of the scribe area 1B is also removed. Thereafter, heat treatment is applied to cure the insulating film RS. The opening OP2 is formed so as to penetrate the insulating film RS so that at least part of the pad PD is exposed from the opening OP2. That is, the opening OP2 of the insulating film RS is formed so as to include the opening OP1 of the insulating film PA in plan view, and at least part of the pad PD is exposed from the opening OP2 of the insulating film RS and the opening OP1 of the insulating film PA.

Also, as another form, it is also possible to form the opening OP2 in the insulating film RS and remove the insulating film RS of the scribe area 1B by dry etching the insulating film RS using as an etching mask, the photoresist layer formed over the insulating film RS using the photolithography technique. In such a case, the insulating film RS need not be the photosensitive resin film.

There are the following two reasons as reasons why the insulating film RS of the scribe area 1B is preferably removed.

The first reason is that there is concern that when the insulating film RS exists in the scribe area 1B, a crack generated due to the cutting of the insulating film RS of the scribe area 1B by a dicing blade in a dicing process to be described later extends to within the chip area through the insulating film RS. Therefore, the insulating film RS is preferably removed in the scribe area 1B. Thus, since the insulating film RS is not cut by the dicing blade in the dicing process to be described later, it is possible to solve apprehension of the crack generated by cutting of the insulating film RS of the scribe area 1B by the dicing blade extending to within the chip area through the insulating film RS. For reasons similar to it, the insulating film PA of the scribe area 1B is also preferably removed as described above. That is, the insulating film PA is preferably removed in the scribed area 1B. Thus, since the insulating film PA is not cut by the dicing blade in a dicing process to be described later, it is possible to solve apprehension of a crack generated by cutting of the insulating film PA of the scribe area 1B by the dicing blade extending to within the chip area through the insulating film PA.

The second reason is that since it is hard for the resin film to be cut by the dicing blade when the dicing process is done in the state in which the insulating film RS is being formed in the scribe area 1B, it becomes hard to perform the dicing process, whereas since the insulating film RS need not be cut by the dicing blade if the insulating film RS is removed from the scribe area 1B, it becomes easy to perform the dicing process.

Figure 19:
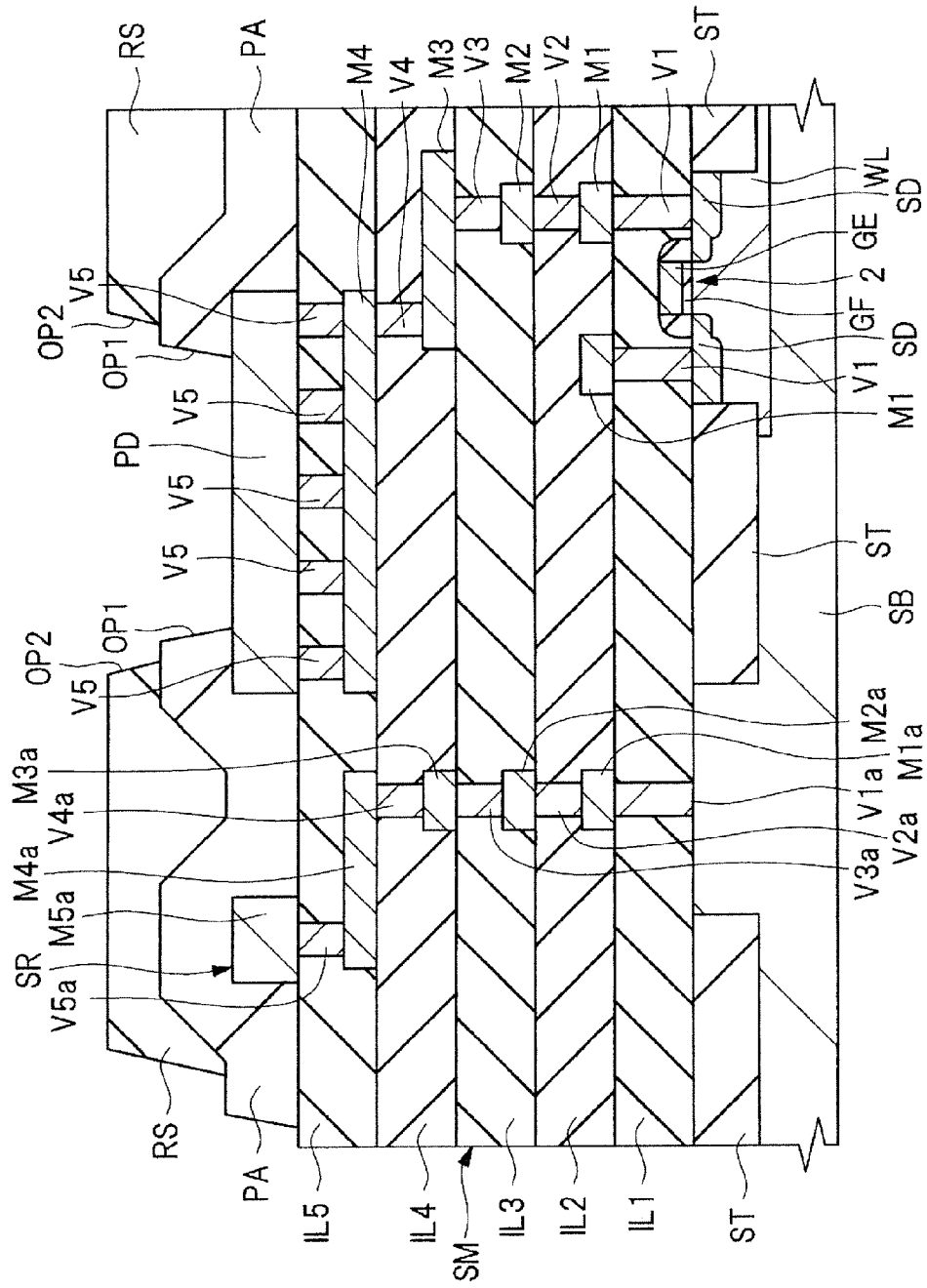
FIG. 19 is a fragmentary sectional view following FIG. 18 in the manufacturing process of the semiconductor device.

Thereafter, by performing the dicing process, the semiconductor substrate SB is cut (diced) to divide it into a plurality of semiconductor chips (individualization). That is, the semiconductor substrate SB is cut along the scribe area 1B. Thus, a semiconductor chip (semiconductor device CP) is obtained from each chip area of the semiconductor substrate SB (semiconductor wafer). Since the semiconductor substrate SB and the laminated structure over the semiconductor substrate SB are cut in the scribe area 1B, the scribe area 1B is cut and removed. When the metal patterns M1b, M2b, M3b, M4b, and M5b have been formed in the scribe area 1B, they are also removed together with the semiconductor substrate SB of the scribe area 1B in the dicing process. FIG. 19 corresponds to a structure in which the scribe area 1B is cut and removed from the structure of FIG. 18 by dicing. FIG. 19 corresponds to FIG. 2 shown above. A cut surface by dicing becomes the side surface SM of the semiconductor device (semiconductor chip). Incidentally, the thickness of the semiconductor substrate SB may be made thin by back-polishing the semiconductor substrate SB before dicing.

<Concerning Examined Examples>

Figure 20:
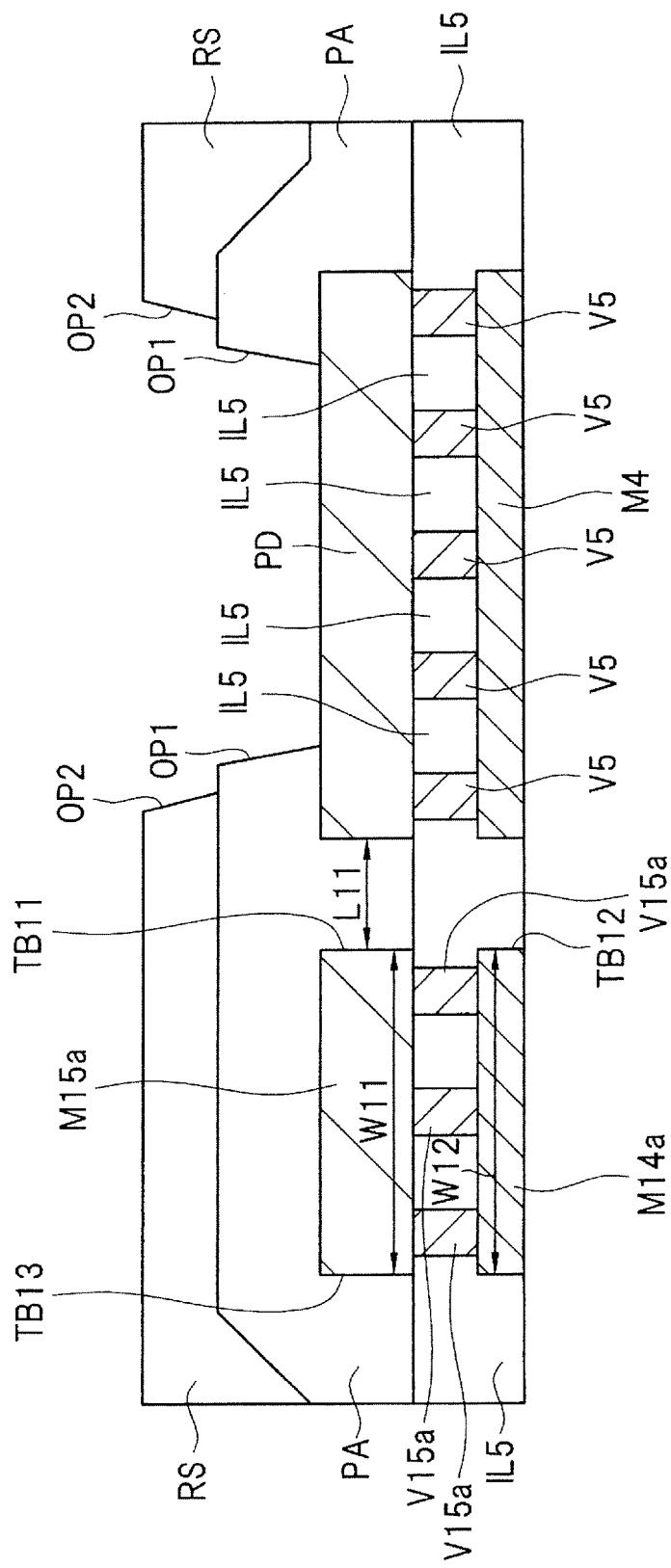
FIG. 20 is a fragmentary sectional view of a semiconductor device according to a first examined example.
Figure 21:
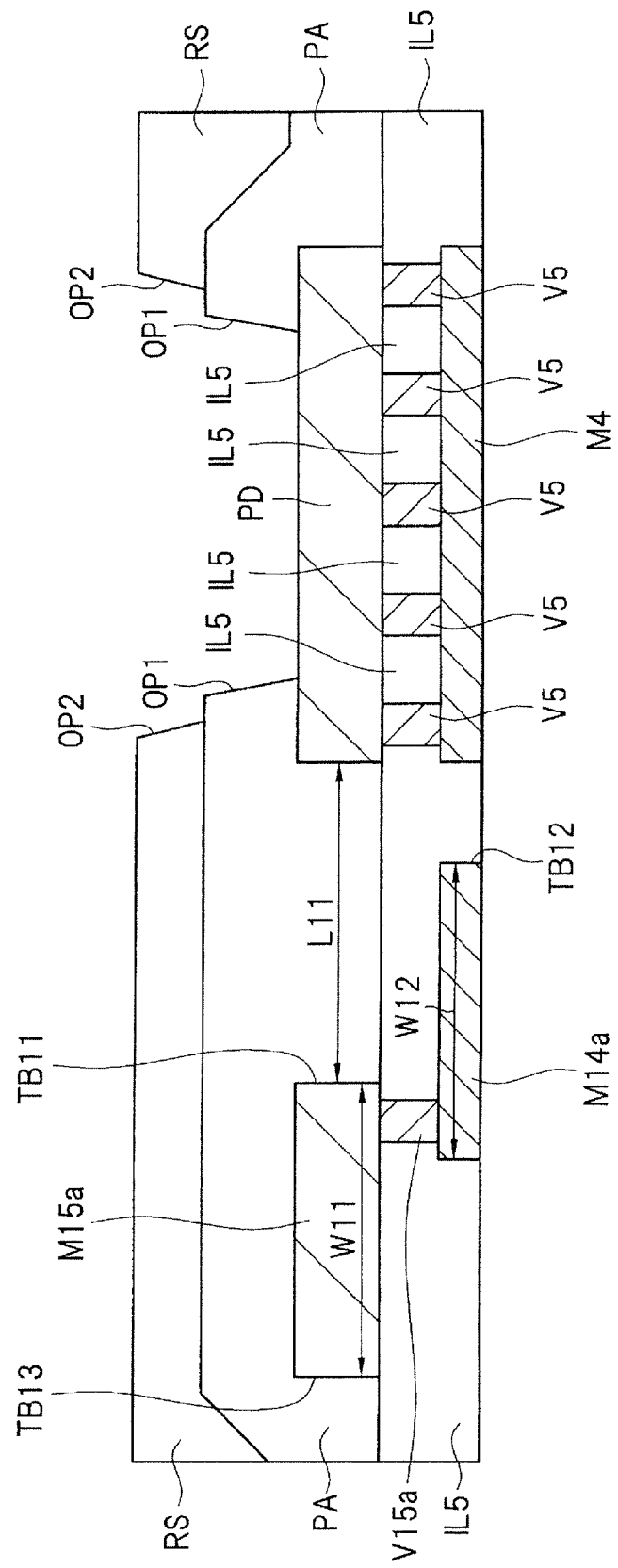
FIG. 21 is a fragmentary sectional view of a semiconductor device according to a second examined example.

FIG. 20 is a fragmentary sectional view of a semiconductor device according to a first examined example discussed by the present inventors. FIG. 21 is a fragmentary sectional view of a semiconductor device according to a second examined example discussed by the present inventors. They are respectively sectional views corresponding to FIG. 3 shown above. Even in FIGS. 20 and 21 as with FIG. 3 shown above, the structure located lower than the interlayer insulating film IL4 is not illustrated. Further, in order to make it easy to see the drawing, the interlayer insulating film IL5, insulating film PA and insulating film RS are not hatched.

The semiconductor device according to the first examined example shown in FIG. 20, and the semiconductor device according to the second examined example shown in FIG. 21 are different from the semiconductor device according to the present embodiment shown in FIG. 1 through 4 in terms of the configuration of a sealring. In particular, of wirings which configure the sealring, a wiring at the uppermost layer and a wiring located one layer lower than the uppermost layer wiring are different in layout from each other.

A sealring wiring M14a, a sealring via portion V15a and a sealring wiring M15a in the semiconductor device according to the first examined example shown in FIG. 20 respectively correspond to the sealring wiring M4a, sealring via portion V5a and sealring wiring M5a in the present embodiment. That is, while the sealring wiring M14a, via portion V15a and wiring M15a are components for the sealring, the sealring wiring M15a is formed in a wiring layer at the uppermost layer, the sealring wiring M14a is formed in a wiring layer located one layer lower than the uppermost wiring layer, and the sealring via portion V15a is formed between the sealring wiring M15a and the sealring wiring M14a.

In the semiconductor device according to the first examined example shown in FIG. 20, the width W11 of the sealring wiring M15a and the width W12 of the sealring wiring M14a are the same (i.e., W11=W12). Then, the position of a side surface (end) TB11 on the inner peripheral side of the sealring wiring M15a and the position of a side surface (end) TB12 on the inner peripheral side of the sealring wiring M14a are matched with each other in plan view. Here, the side surface TB11 on the inner peripheral side of the sealring wiring M15a corresponds to the side surface on the inner peripheral side (inside) of the annular wiring M15a, and the side surface TB12 on the inner peripheral side of the sealring wiring M14a corresponds to the side surface on the inner peripheral side (inside) of the annular wiring M14a.

According to the discussions of the present inventors, it has been found that the following problems arise in the case of the semiconductor device according to the first examined example shown in FIG. 20.

In the case of the semiconductor device according to the first examined example shown in FIG. 20, the sealring wiring M15a is close to a pad PD, and the distance (interval) L11 between the sealring wiring M15a and the pad PD becomes small. When the distance L11 between the sealring wiring M15a and the pad PD is small, a crack becomes easy to occur in an insulating film PA of a portion sandwiched between the sealring wiring M15a and the pad PD. That is, there is a fear that since the sealring wiring M15a and the pad PD are different in thermal expansion efficient from the insulating films PA and RS, stress by the sealring wiring M15a and the pad PD acts on the insulating film PA of the portion sandwiched between the sealring wiring M15a and the pad PD when a thermal load is applied to the semiconductor device, and a crack will occur in the insulating film PA due to the stress. Easiness of occurrence of the crack depends on the distance L11 between the sealring wiring M15a and the pad PD. As the distance L11 becomes smaller, the crack becomes easy to occur in the insulating film PA of the portion sandwiched between the sealring wiring M15a and the pad PD. Incidentally, even when one adjacent to the sealring wiring M15a is not the pad PD but a wiring M5 of the same layer as the pad PD, a similar problem arises. When the distance (interval) between the sealring wiring M15a and the wiring M5 is small, a crack is likely to occur in the insulating film PA of the portion sandwiched between the sealring wiring M15a and the wiring M5. When the crack occurs in the insulting film PA, the crack becomes an intrusion route of moisture or the like, thereby causing degradation in reliability of the semiconductor device. It is therefore desired that the occurrence of the crack in the insulating film PA is prevented as much as possible.

Further, there is also a fear that since stress applied to the pad PD via the insulating film PA by the sealring wiring M15 becomes large when the distance (interval) L11 between the sealring wiring M15a and the pad PD is small, the reliability of the pad PD is degraded. Incidentally, even when one adjacent to the sealring wiring M15a is not the pad PD but the wiring M5 of the same layer as the pad PD, a similar problem arises. There is also a fear that since stress applied to the wiring M5 via the insulating film PA by the sealring wiring M15a becomes large when the distance (interval) between the sealring wiring M15a and the wiring M5 is small, the reliability of the wiring M5 is degraded.

On the other hand, in the case of the semiconductor device according to the second examined example shown in FIG. 21, the position and size of the sealring wiring M14a, and the size of the sealring wiring M15a are made equal to those in the first examined example shown in FIG. 20, but the position of the sealring wiring M15a is moved outside as compared with the case of the first examined example shown in FIG. 20. That is, in the semiconductor device according to the first examined example shown in FIG. 20, the position of the sealring wiring M15a, which has been shifted outward while maintaining the size of the sealring wiring M15a, corresponds to that in the second examined example shown in FIG. 21.

Therefore, it is common between the first examined example shown in FIG. 20 and the second examined example shown in FIG. 21 that the width W11 of the sealring wiring M15a and the width W12 of the sealring wiring M14a are same (i.e., W11 =W12). The first examined example shown in FIG. 20 and the second examined example shown in FIG. 21 are however different in the following points. That is, in the first examined example shown in FIG. 20, the position of the side surface TB11 on the inner peripheral side of the sealring wiring M15a and the position of the side surface TB12 on the inner peripheral side of the sealring wiring M14a coincide with each other in plan view. On the other hand, in the second examined example shown in FIG. 21, the position of the side surface TB11 on the inner peripheral side of the sealring wiring M15a is located outward (on the side close to the side surface SM of the semiconductor device) from the position of the side surface TB12 on the inner peripheral side of the sealring wiring M14a in plan view.

In the case of the second examined example shown in FIG. 21 as compared with the first examined example shown in FIG. 20, the distance (interval) L11 between the sealring wiring M15a and the pad PD can be increased by the shift of the position of the sealring wiring M15a to the outside. That is, the distance L11 in the second examined example shown in FIG. 21 becomes larger than the distance L11 in the first examined example shown in FIG. 20. Therefore, in the second examined example shown in FIG. 21 as compared with the first examined example shown in FIG. 20, the distance L11 between the sealring wiring M15a and the pad PD is large. Thus, it is possible to suppress a crack from occurring in the insulating film PA of the portion sandwiched between the sealring wiring M15a and the pad PD. This is because as described above, the crack becomes easy to occur in the insulating film PA of the portion sandwiched between the sealring wiring M15a and the pad PD as the distance L11 between the sealring wiring M15a and the pad PD becomes smaller. Further, in the second examined example shown in FIG. 21 as compared with the first examined example shown in FIG. 20, the influence of stress applied to the pad PD via the insulating film PA by the sealring wiring M15a can be reduced because the distance (interval) L11 between the sealring wiring M15a and the pad PD is large, thus making it possible to improve the reliability of the pad PD.

However, in the case of the second examined example shown in FIG. 21 as compared with the first examined example shown in FIG. 20, the planar size of the semiconductor device becomes large by the shift of the position of the sealring wiring M15a to the outside. Therefore, the present example becomes disadvantageous in size reduction (reduction in area) of the semiconductor device.

Further, in the second examined example shown in FIG. 21, there is no difference in that even if the position of the sealring wiring M14a is shifted to the outside in alignment with the position of the sealring wiring M15a, the planar size of the semiconductor device becomes large. This is still disadvantageous in miniaturization of the semiconductor device.

That is, the shifting of the position of the sealring wiring M15a to the outside while maintaining the size of the sealring wiring M15a will lead to an increase in the planar size of the semiconductor device.

<Main Features and Advantageous Effects>

The semiconductor device according to the present embodiment has the semiconductor substrate SB, the wiring structure (multilayer wiring structure) formed over the semiconductor substrate SB and including the wiring layers, and the sealring (SR) formed along the periphery of the semiconductor substrate SB in the wiring structure. The sealring (SR) has the structure in which the sealring wirings (M1a through M5a) respectively formed in the wiring layers of the wiring structure are laminated. The position of the side surface (TB1) on the inner peripheral side of the sealring wiring M5a (first sealring wiring) formed in the wiring layer at the uppermost layer is located more outside than the position of the side surface (TB2) on the inner peripheral side of the sealring wiring M4a (second sealring wiring) formed in the wiring layer located one layer lower than the wiring layer at the uppermost layer. Further, the width (W1) of the sealring wiring M5a is smaller than the width (W2) of the sealring wiring M4a.

One of the main features of the present embodiment resides in that the position of the side surface (end) TB1 on the inner peripheral side of the sealring wiring M5a formed in the wiring layer at the uppermost layer is located more outside than the position of the side surface (end) TB2 on the inner peripheral side of the sealring wiring M4a formed in the wiring layer located one layer lower than the wiring layer at the uppermost layer. In other words, the position of the side surface TB2 on the inner peripheral side of the sealring wiring M4a is located more inside than the position of the side surface TB1 on the inner peripheral side of the sealring wiring M5a. Here, the outside corresponds to the side close to the outer periphery (side surface SM) of the semiconductor device CP in plan view, and the inside corresponds to the far side from the outer periphery (side surface SM) of the semiconductor device CP in plan view. Also, the side surface TB1 on the inner peripheral side of the sealring wiring M5a corresponds to the side surface on the inner peripheral side (inside) of the annular wiring M5a, and the side surface TB2 on the inner peripheral side of the sealring wiring M4a corresponds to the side surface on the inner peripheral side (inside) of the annular wiring M4a. Further, the side surface TB3 on the outer peripheral side of the sealring wiring M5a corresponds to the side surface on the outer peripheral side (outside) of the annular wiring M5a, and the side surface TB4 on the outer peripheral side of the sealring wiring M4a corresponds to the side surface on the outer peripheral side (outside) of the annular wiring M4a. In the sealring wiring M5a, the side surface TB1 on the inner peripheral side and the side surface TB3 on the outer peripheral side are side surfaces on the sides opposite to each other. Further, in the sealring wiring M4a, the side surface TB2 on the inner peripheral side and the side surface TB4 on the outer peripheral side are side surfaces on the sides opposite to each other.

Here, in the wiring layer at the uppermost layer, the distance (interval) between the sealring wiring M5a and the pad PD or the wiring M5 closest to the sealring wiring M5a is assumed to be called a distance (interval) L1. In the case of FIGS. 3 and 4 shown above, the pad PD is closest to the sealring wiring M5a. The distance (interval) between the pad PD and the sealring wiring M5a corresponds to the distance (interval) L1. Further, in the case of FIGS. 5 and 6 shown above, the wiring M5 is closest to the sealring wiring M5a. The distance (interval) between the wiring M5 and the sealring wiring M5a corresponds to the distance (interval) L1.

As described in the first examined example, when the above distances L11 and L1 are small, the crack becomes easy to occur in the insulating film PA of the portion sandwiched between the sealring wiring M5a (M15a) and the pad PD or the wiring M5 close thereto, thus causing a fear that the reliability of the semiconductor device is degraded. This crack becomes easy to occur as the above distances L11 and L1 become small. Further, when the above distances L11 and L1 are small, stress applied to the pad PD or the wiring M5 close to the sealring wiring M5a (M15a) via the insulating film PA by the sealring wiring M5a (M15a) becomes large. Therefore, there is also a fear that the reliability of the pad PD or the wiring M5 is degraded.

However, as in the first examined example of FIG. 20 shown above, when the position of the side surface TB11 on the inner peripheral side of the sealring wiring M15a and the position of the side surface TB12 on the inner peripheral side of the sealring wiring M14a coincide with each other in plan view, the distance L11 between the sealring wiring M15a and the pad PD or the wiring M5 formed in the wiring layer at the uppermost layer becomes small.

On the other hand, in the present embodiment, the distance L1 between the sealring wiring M5a and the pad PD or the wiring M5 can be increased by the shift of the position of the side surface TB1 on the inner peripheral side of the sealring wiring M5a to the outside (side close to the side surface SM of the semiconductor device) from the position of the side surface TB2 on the inner peripheral side of the sealring wiring M4a in plan view.

That is, in the case of the present embodiment shown in FIGS. 3 through 6 rather than the case of the first examined example shown in FIG. 20, the distance L1 between the sealring wiring M5a and the pad PD or the wiring M5 can be increased by the shift of the position of the side surface TB1 on the inner peripheral side of the sealring wiring M5a to the outside (side close to the side surface SM of the semiconductor device) from the position of the side surface TB2 on the inner peripheral side of the sealring wiring M4a. That is, the distance L1 in the present embodiment becomes larger than the distance L1 in the first examined example shown in FIG. 20.

Therefore, in the present embodiment shown in FIGS. 3 through 6 as compared with the first examined example shown in FIG. 20, it is possible to suppress the generation of the crack in the insulating film PA of the portion sandwiched between the sealring wiring M5a and the pad PD or the wiring M5 since the distance L1 between the sealring wiring M5a and the pad PD or the wiring M5 is large. This is because as the distance L1 between the sealring wiring M5a and the pad PD or the wiring M5 becomes smaller, the crack becomes easy to occur in the insulating film PA of the portion sandwiched between the sealring wiring M5a and the pad PD. Further, in the present embodiment shown in FIGS. 3 through 6 as compared with first examined example shown in FIG. 20, the influence of stress applied to the pad PD or the wiring M5 via the insulating film PA by the sealring wiring M5a can be reduced because the distance L1 between the sealring wiring M5a and the pad PD or the wiring M5 is large, thus making it possible to improve the reliability of the pad PD and the wiring M5.

Another one of the main features of the present embodiment resides in that the width (W1) of the sealring wiring M5a is smaller than the width (W2) of the sealring wiring M4a.

That is, in the present embodiment, as understood even from FIGS. 3 through 6 shown above, the width W1 of the sealring wiring M5a formed in the wiring layer at the uppermost layer is smaller than the width W2 of the sealring wiring M4a formed in the wiring layer located one layer lower than the wiring layer at the uppermost layer (i.e., W1<W2). In other words, the width W2 of the sealring wiring M4a is larger than the width W1 of the sealring wiring M5a. Here, the width W1 of the sealring wiring M5a is a width in plan view and in the sealring wiring M5a formed in the wiring layer at the uppermost layer, corresponds to a width (size) in the direction perpendicular to the extending direction of the sealring wiring M5a. Further, the width W2 of the sealring wiring M4a is a width in plan view and in the sealring wiring M4a formed in the wiring layer located one layer lower than the wiring layer at the uppermost layer, corresponds to a width (size) in the direction perpendicular to the extending direction of the sealring wiring M4a.

As in the second examined example of FIG. 21 shown above, when the position of the sealring wiring M15a is shifted outside while the width W11 of the sealring wiring M15a is being kept equal to the width W12 of the sealring wiring M14a, this will cause an increase in the planar size of the semiconductor device.

On the other hand, in the present embodiment, not only the position of the side surface TB1 on the inner peripheral side of the sealring wiring M5a is shifted to the outside (side close to the side surface SM of the semiconductor device) from the position of the side surface TB2 on the inner peripheral side of the sealring wiring M4a, but also the width W1 of the sealring wiring M5a is made smaller than the width W2 of the sealring wiring M4a (i.e., W1<W2). Thus, it is possible to suppress or prevent the planar size (area) of the semiconductor device from increasing and hence achieve miniaturization (reduction in area) of the semiconductor device.

That is, as in the second examined example illustrated in FIG. 21 shown above, when the position of the sealring wiring M15a is shifted to the outside while the width W11 of the sealring wiring M15a is being kept equal to the width W12 of the sealring wiring M14a, the position of the side surface SM of the semiconductor device is also shifted by the movement of the position of the side surface TB13 on the outer peripheral side of the sealring wiring M15a to the outside to increase the planar size of the semiconductor device. This is because there is a need to secure to a certain degree, the distance between the side surface TB13 on the outer peripheral side of the sealring wiring M15a and the side surface SM of the semiconductor device for easiness of manufacturing the semiconductor device and an improvement in its reliability.

On the other hand, in the present embodiment shown in FIGS. 3 through 6, since the width W1 of the sealring wiring M5a is made smaller than the width W2 of the sealring wiring M4a even if the position of the side surface TB1 on the inner peripheral side of the sealring wiring M5a is shifted to the outside, the position of the side surface (end) TB3 on the outer peripheral side of the sealring wiring M5a can be suppressed or prevented from being moved outside. That is, when the second examined example shown in FIG. 21 and the present embodiment shown in FIGS. 3 through 6 are compared, the position of the side surface TB3 on the outer peripheral side of the sealring wiring M5a in the present embodiment can be set more inside than the position of the side surface TB13 on the outer peripheral side of the sealring wiring M15a in the second examined example where the above distances L11 and L1 are the same. Therefore, when the distance between each of the side surfaces TB13 and TB3 on the outer peripheral sides of the sealring wirings M15a and M5a and the side surface SM of the semiconductor device is made same to the above second examined example and the present embodiment, the present embodiment than the second examined example is capable of reducing the planar size (area) of the semiconductor device. Accordingly, the present embodiment rather than the second examined example is advantageous for miniaturization (reduction in area) of the semiconductor device.

Further, the sealring SR is made available even in the inspection of the semiconductor device at its manufacture. It is therefore desirable to secure the visibility (easiness to see) of the sealring SR. For example, while a visual inspection is performed on the semiconductor wafer before the dicing process in which the semiconductor wafer (semiconductor substrate SB) is cut along the scribe area, the sealring SR may preferably be made visible upon its visual inspection. This is because if the sealring SR can visually be recognized, it is possible to confirm whether a problem exists in the position of the outer periphery of the protection film (insulting film RS herein) at the uppermost layer with the visually-recognized sealring SR as a reference. Incidentally, since the protection film (insulating film RS herein) at the uppermost layer is formed in the chip area, but is not formed in the scribe area, it is easy to confirm whether the problem exists in the position of the outer periphery of the protection film (insulating film RS herein) at the uppermost layer, if it is possible to confirm the position of the outer periphery of the protection film (insulting film RS herein) at the uppermost layer with the position of the sealring SR as the reference.

The sealring SR is formed of a metal material. It is possible to visually recognize the position of the sealring SR through the insulating film which covers the sealring SR. However, in the sealring wirings M5a through M1a that configure the sealring SR, visibility (easiness to see) is degraded as the wiring is arranged toward the lower layer. That is, of the sealring wirings M5a, M4a, M3a, M2a, and M1a, the sealring wiring M5a at the uppermost layer is most easily visualized. Next, it is easy to visually recognize the sealring wiring M4a. It becomes hard to visually recognize the wirings in the order of the sealring wirings M3a, M2a and M1a. Further, the visibility of each sealring wiring becomes high as the width of the sealring wiring becomes larger.

In the present embodiment, the position of the side surface TB1 on the inner peripheral side of the sealring wiring M5a formed in the wiring layer at the top layer is located more outside than the position of the side surface TB2 on the inner peripheral side of the sealring wiring M4a formed in the wiring layer located one layer lower than the wiring layer at the uppermost layer, and the width W1 of the sealring wiring M5a is made smaller than the width W2 of the sealring wiring M4a. That is, the width W2 of the sealring wiring M4a is larger than the width W1 of the sealring wiring M5a (i.e., W2>W1). Therefore, even if the width W1 of the sealring wiring M5a formed in the wiring layer at the uppermost layer is small, the width W2 of the sealring wiring M4a formed in the wiring layer located one layer lower than the wiring layer at the uppermost layer is larger than the width W1 of the sealring wiring M5a, thus making it possible to enhance the visibility of the sealring wiring M4a and thereby secure the visibility of the sealring SR.

That is, assume where in the first examined example of FIG. 20 shown above, the above distance L11 is made large while the position of the side surface TB11 on the inner peripheral side of the sealring wiring M15a and the position of the side surface TB12 on the inner peripheral side of the sealring wiring M14a are made to coincide with each other by reducing both of the width W11 of the sealring wiring M15a and the width W12 of the sealring wiring M14a. In this case, since the visibility of the sealring is degraded due to the reduction in both of the width W11 of the sealring wiring M15a and the width W12 of the sealring wiring M14a, it becomes hard to perform a visual inspection using the sealring.

On the other hand, in the present embodiment, since the width W2 of the sealring wiring M4a formed in the wiring layer located one layer lower than the wiring layer at the uppermost layer is larger than the width W1 of the sealring wiring M5a formed in the wiring layer at the uppermost layer, the degradation in the visibility of the sealring wiring M5a due to the reduction in the width W1 can be compensated with the visibility of the sealring wiring M4a large in the width W2.

That is, in the present embodiment, while maintaining the width W2 of the sealring wiring M4a easy to secure the visibility after the sealring wiring M5a, the position of the side surface TB1 on the inner peripheral side of the sealring wiring M5a is shifted more outside than the position of the side surface TB2 on the inner peripheral side of the sealring wiring M4a, and the width W1 of the sealring wiring M5a is made smaller than the width W2 of the sealring wiring M4a. Thus, while securing the visibility of the sealring SR, the distance L1 between the sealring wiring M5a and the pad PD or the wiring M5 closest to the sealring wiring M5a can be made large in the wiring layer at the uppermost layer. By securing the visibility of the sealring SR, it becomes easy to perform the inspection using the sealring SR at the manufacture of the semiconductor device. Although the visual inspection is performed on the semiconductor wafer before the dicing process of cutting the semiconductor wafer (semiconductor substrate SB) along the scribe area, for example, the sealring SR can appropriately be visually-recognized upon its visual inspection. Thus, it is possible to appropriately confirm whether a problem exists in the position of the outer periphery of the protection film (insulating film RS herein) at the uppermost layer with the visually-recognized sealring SR as a reference. It becomes easy to manufacture the semiconductor device by securing the visibility of the sealring SR.

Thus, in the present embodiment, the position of the side surface TB1 on the inner peripheral side of the sealring wiring M5a formed in the wiring layer at the uppermost layer is located more outside than the position of the side surface TB2 on the inner peripheral side of the sealring wiring M4a formed in the wiring layer located one layer lower than the wiring layer at the uppermost layer, and the width W1 of the sealring wiring M5a is set smaller than the width W2 of the sealring wiring M4a. Thus, while securing the visibility of the sealring SR, the distance L1 between the sealring wiring M5a and the pad PD or the wiring M5 closest to the sealring wiring M5a can be made large in the wiring layer at the uppermost layer, and the position of the side surface TB3 on the outer peripheral side of the sealring wiring M5a can be suppressed or prevented from being moved to the outside. Therefore, in the present embodiment, the distance L1 between the sealring wiring M5a and the pad PD or the wiring M5 closest to the sealring wiring M5a can be increased while securing the visibility of the sealring SR and suppressing or preventing an increase in the planar size of the semiconductor device. With the increase in the distance L1, it is possible to suppress a crack from occurring in the insulating film PA of the portion sandwiched between the sealring wiring M5a and the pad PD or the wiring M5. Further, the influence of stress applied to the pad PD or the wiring M5 via the insulating film PA by the sealring wiring M5a can be reduced. Therefore, it is possible to enhance the reliability of the semiconductor device. Thus, an improvement in the reliability of the semiconductor device and miniaturization (reduction in area) of the semiconductor device can be made compatible. Further, the semiconductor device is easy to manufacture by securing the visibility of the sealring SR.

Next, other features of the present embodiment will further be described below.

In a viewpoint that although the width W1 of the sealring wiring M5a is smaller than the width W2 of the sealring wiring M4a, the reliability of the semiconductor device is enhanced as much as possible by making the above distance L1 as large as possible, and a viewpoint that the planar size of the semiconductor device is suppressed as much as possible, it is desirable to make the width W1 of the sealring wiring M5a as small as possible. Therefore, in the present embodiment, the width W1 of the sealring wiring M5a formed in the wiring layer at the uppermost layer is more preferably identical to the width of the minimum width wiring in the wiring layer at the uppermost layer. That is, of each wiring M5 formed in the wiring layer at the uppermost layer, the width of the wiring M5 smallest in width, and the width W1 of the sealring wiring M5a are more preferably same. Here, the minimum width wiring in the wiring layer at the uppermost layer corresponds to the wiring smallest in width, of each wiring M5 formed in the wiring layer at the uppermost layer. Further, the width of the wiring corresponds to the width (size) in the direction perpendicular to the extending direction of the wiring.

Since the minimum width wiring in the wiring layer at the uppermost layer is formed so as to match with the minimum working size, the width W1 of the sealring wiring M5a becomes identical to the width of the minimum width wiring in the wiring layer at the uppermost layer when the width W1 of the sealring wiring M5a is matched with the minimum working size. Thus, since it is possible to make the width W1 of the sealring wiring M5a as small as possible, the effect of increasing the above distance L1 and thereby enhancing the reliability of the semiconductor device can be improved. It is also possible to enhance the effect of suppressing the planar size of the semiconductor device.

When the width W1 of the sealring wiring M5a is set identical to the width of the minimum width wiring in the wiring layer at the uppermost layer, the width W1 of the sealring wiring M5a can be taken to be about 0.8 to 1.0 μm, for example although it depends even on the thickness of the sealring wiring M5a.

Further, in the present embodiment, the thickness of the sealring wiring M5a formed in the wiring layer at the uppermost layer is preferably thicker than the thickness of the sealring wiring M4a formed in the wiring layer located one layer lower than the wiring layer at the uppermost layer. Reasons for that are as follows.

That is, while the wiring structure including the wiring layers is formed over the semiconductor substrate SB, the thickness of each of the wiring (wiring M5 herein) and the pad (pad PD herein) formed in the wiring layer at the uppermost layer is preferably thicker than the thickness of each of the wirings (wirings M1, M2, M3, and M4 herein) formed in the wiring layer located lower than the wiring and the pad. This is because it is desirable that the pad (pad PD herein) corresponding to the external terminal of the semiconductor device is formed in the wiring layer at the uppermost layer, but the thickness of the pad (PD) is made thick when considering the function as the external terminal of the pad (PD). For example, when the thickness of the pad (PD) is made thick, a probe test using the pad (PD) can be performed appropriately. Also, the coupling member (e.g., bonding wire or the like) for external coupling to the pad (PD) becomes easy to be appropriately coupled. Further, since each sealring wiring is formed of the same material in the same process as the wiring of the same layer in each wiring layer, the sealring wiring has substantially the same thickness as the wiring of the same layer. Therefore, the sealring wiring M5a has substantially the same thickness as the wiring M5 and the pad PD. The sealring wiring M4a has substantially the same thickness as the wiring M4. The sealring wiring M3a has substantially the same thickness as the wiring M3. The sealring wiring M2a has substantially the same thickness as the wiring M2. The sealring wiring M1a has substantially the same thickness as the wiring M1. Accordingly, the thickness of the sealring wiring M5a formed in the wiring layer at the uppermost layer is thicker than the thickness of the sealring wiring M4a formed in the wiring layer located one layer lower than the wiring layer at the uppermost layer.

To mention examples of the thickness, the thickness of the sealring wiring M5a can be taken to be about 1.5 to 2 μm, for example. The thickness of the sealring wiring M4a can be taken to be about 0.3 to 0.6 μm, for example.

Here, the thickening of the thickness of the sealring wiring (M5a, M15a) formed in the wiring layer at the uppermost layer leads to the problem described in the first examined example illustrated in FIG. 20 shown above being likely to occur. That is, when the sealring wiring M15a, pad PD and wiring M5 are thick in thickness in the first examined example illustrated in FIG. 20 shown above, the influence of stress generated by them also becomes large. In this case, a crack becomes easy to further occur in the insulating film PA of the portion sandwiched between the sealring wiring M15a and the pad PD or the wiring M5 close thereto. Further, stress applied to the pad PD or the wiring M5 close to the sealring wiring M15a via the insulating film PA by the sealring wiring M15a becomes larger.

On the other hand, in the present embodiment, as described above, the distance L1 between the sealring wiring M5a and the pad PD or the wiring M5 can be increased by shifting the position of the side surface TB1 on the inner peripheral side of the sealring wiring M5a to the outside (side close to the side surface SM of the semiconductor device) from the position of the side surface TB2 on the inner peripheral side of the sealring wiring M4a in plan view. Therefore, in the present embodiment, since the distance L1 between the sealring wiring M5a and the pad PD or the wiring M5 is great even if the thicknesses of the sealring wiring M5a, the pad PD and the wiring M5 are thick, it is possible to suppress the generation of the crack in the insulating film PA of the portion sandwiched between the sealring wiring M5a and the pad PD or the wiring M5. Further, since the distance L1 between the sealring wiring M5a and the pad PD or the wiring M5 is great even if the thicknesses of the sealring wiring M5a, the pad PD and the wiring M5 are thick, it is possible to reduce the influence of stress applied to the pad PD or the wiring M5 via the insulating film PA by the sealring wiring M5a. Thus, it is possible to enhance the reliability of the semiconductor device.

Also, in the present embodiment, as described above, the position of the side surface TB1 on the inner peripheral side of the sealring wiring M5a is located more outside (side close to the side surface SM of the semiconductor device) than the position of the side surface TB2 on the inner peripheral side of the sealring wiring M4a in plan view. In other words, the position of the side surface TB2 on the inner peripheral side of the sealring wiring M4a is located more inside (side far from the side surface SM of the semiconductor device) than the position of the side surface TB1 on the inner peripheral side of the sealring wiring M5a. This acts so as to increase the distance L1 between the sealring wiring M5a and the pad PD or the wiring M5 formed in the wiring layer at the uppermost layer, but does not act so as to increase the distance L2 (interval) between the sealring wiring M4a and the wiring M4 formed in the wiring layer located one layer lower than the wiring layer at the uppermost layer. However, the thickness of each of the sealring wiring M4a and the wiring M4 is thinner than the thickness of each of the sealring wiring M5a, the pad PD and the wiring M5 formed in the wiring layer at the uppermost layer. Therefore, even if the distance L2 between the sealring wiring M4a and the wiring M4 is small, a crack is hard to occur in the insulating film (IL5) of the portion sandwiched between the sealring wiring M4a and the wiring M4. Further, stress applied to the wiring M4 adjacent to the sealring wiring M4a via the insulating film (IL5) by the sealring wiring M4a is not increased. This hardly leads to degradation in the reliability of the wiring M4. This is because the influence of stress due to the sealring wiring becomes large as the thickness of the sealring wiring becomes thick. That is, if the thickness of the sealring wiring becomes thin, the influence of the stress due to the sealring wiring becomes relatively small. Here, in the wiring layer located one layer lower than the wiring layer at the uppermost layer, the distance (interval) between the sealring wiring M4a and the wiring M4 closest to the sealring wiring M4a is assumed to be called a distance (interval) L2.

That is, in the present embodiment, since the wiring thickness is thick in the wiring layer at the uppermost layer, the distance L1 between the sealring wiring M5a and the pad PD or the wiring M5 is increased to suppress the influence of the stress by the sealring wiring M5a, whereby the reliability of the semiconductor device is improved. On the other hand, since the wiring thickness is thin in the wiring layer located one layer lower than the wiring layer at the uppermost layer as compared with the wiring layer at the uppermost layer, the width W2 of the sealring wiring M4a is increased without attention to the distance L2 between the sealring wiring M4a and the wiring M4, whereby the visibility of the sealring SR is enhanced. Therefore, in the present embodiment, there has been adopted a configuration of in plan view, shifting the position of the side surface TB1 on the inner peripheral side of the sealring wiring M5a more outside (side close to the side surface SM of the semiconductor device) than the position of the side surface TB2 on the inner peripheral side of the sealring wiring M4a and making the width W1 of the sealring wiring M5a smaller than the width W2 of the sealring wiring M4a.

Also, in the present embodiment, the position of the side surface TB1 on the inner peripheral side of the sealring wiring M5a is shifted more outside (side close to the side surface SM of the semiconductor device) than the position of the side surface TB2 on the inner peripheral side of the sealring wiring M4a in plan view. Therefore, the distance (interval) L1 between the sealring wiring M5a and another wiring M5 or pad PD in the wiring layer at the uppermost layer can become larger than the distance (interval) L2 between the sealring wiring M4a and another wiring M4 in the wiring layer located on layer lower than the wiring layer at the uppermost layer (i.e. L1>L2). Thus, the sealring wiring M5a which could be affected by stress as compared with the sealring wiring M4a is spaced away from the pad PD or the wiring M5 to thereby enable the reliability of the semiconductor device to be enhanced.

Further, although it is possible to enhance the reliability of the semiconductor device by increasing the above distance L1 as described above, it is desirable to make the above distance L1 as large as possible in this viewpoint. Therefore, in the present embodiment, the width W3 of a portion in the sealring wiring M4a, which overlaps with the sealring wiring M5a in plan view is more preferably less than or equal to half the width W2 of the sealring wiring M4a (i.e., W3≤W2/2). In other words, the width (W2−W3) of a portion in the sealring wiring M4a, which does not overlap with the sealring wiring M5a in plan view is more preferably greater than or equal to half the width W2 of the sealring wiring M4a (i.e., W2−W3≥W2/2). Thus, the above distance L1 can appropriately be increased by setting the width W3 of the portion in the sealring wiring M4a, which overlaps with the sealring wiring M5a in plan view to less than or equal to half the width W2 of the sealring wiring M4a (i.e., W3≤W2/2), thereby making it possible to appropriately obtain the effect of improving the reliability of the semiconductor device. Here, as with the width W2, the width W3 also corresponds to the width (size) in the direction perpendicular to the extending direction of the sealring wiring M4a.

Further, the width W2 of the sealring wiring M4a can be changed as required, but is preferably greater than or equal to 2 μm (W2≥2 μm). Thus, the visibility of the sealring wiring M4a can appropriately be enhanced. It becomes easy to appropriately perform a visual inspection using the sealring. Further, since there is a fear that the planar size of the semiconductor device may cause an increase when the width W2 of the sealring wiring M4a is too large, the width W2 of the sealring wiring M4a is more preferably less than or equal to 10 μm (W2≤10 μm). Therefore, the width W2 of the sealring wiring M4a is especially preferably greater than or equal to 2 μm and less than or equal to 10 μm (2 μm≤W2≤10 μm). Thus, while preventing the increase in the planar size of the semiconductor device, it is possible to enhance the visibility of the sealring wiring M4a and make it easy to appropriately perform the visual inspection using the sealring.

In addition, in plan view, it is possible that there exist where the position of the side surface TB3 on the outer peripheral side of the sealring wiring M5a is located more inside than the position of the side surface TB4 on the outer peripheral side of the sealring wiring M4a, where the position of the side surface TB3 on the outer peripheral side of the sealring wiring M5a is placed in the same position as the position of the side surface TB4 on the outer peripheral side of the sealring wiring M4a, and where the position of the side surface TB3 on the outer peripheral side of the sealring wiring M5a is located more outside than the position of the side surface TB4 on the outer peripheral side of the sealring wiring M4a. While these are included in the present embodiment, the case in these cases, where the position of the side surface TB3 on the outer peripheral side of the sealring wiring M5a is located more outside (side close to the side surface SM of the semiconductor device) than the position of the side surface TB4 on the outer peripheral side of the sealring wiring M4a in plan view is typically illustrated in FIGS. 3 through 6. Here, as described above, the outside corresponds to the side close to the outer periphery (side surface SM) of the semiconductor device CP in plan view, and the inside corresponds to the side far from the outer periphery (side surface SM) of the semiconductor device CP in plan view.

However, if the position of the side surface TB3 on the outer peripheral side of the sealring wiring M5a is the same as the position of the side surface TB4 on the outer peripheral side of the sealring wiring M4a or is located outside the position thereof in plan view, it becomes easy to increase the above distance L1 as compared with the case where the position of the side surface TB3 on the outer peripheral side of the sealring wiring M5a is located more inside than the position of the side surface TB4 on the outer peripheral side of the sealring wiring M4a. Therefore, it becomes easy to improve the reliability of the semiconductor device.

Also, if the position of the side surface TB3 on the outer peripheral side of the sealring wiring M5a is the same as the position of the side surface TB4 on the outer peripheral side of the sealring wiring M4a or is located inside the position thereof in plan view, this is advantageous for miniaturization (reduction in area) of the semiconductor device as compared with the case where the position of the side surface TB3 on the outer peripheral side of the sealring wiring M5a is located more outside than the position of the side surface TB4 on the outer peripheral side of the sealring wiring M4a.

Further, the widths of the sealring wirings M3a, M2a, and M1a formed lower than the sealring wiring M4a can also be made identical to the width W2 of the sealring wiring M4a, but they are more preferably smaller than the width W2 of the sealring wiring M4a. Reasons for that are as follows.

That is, since it becomes hard to visually recognize each sealring wiring as it is formed in a lower layer, it is hard to secure the visibility of each of the sealring wirings M3a, M2a, and M1a each formed in the layer lower than the sealring wiring M4a as compared with the sealring wiring M4a. Therefore, it is preferable that the width W2 of the sealring wiring M4a is made large to secure the visibility of the sealring SR, and the widths of the sealring wirings M3a, M2a, and M1a each formed in the layer lower than the sealring wiring M4a are made smaller than the width W2 of the sealring wiring M4a. Thus, since arrangement possible areas of the wirings M3, M2, and M1 can be widened, it is possible to relax limitation on layout design of the wirings M3, M2, and M1. Further, limitation on the layout (layout of metal patterns M3b, M2b, and M1b) when the above metal patterns M3b, M2b, and M1b are formed in the scribe area 1B can also be relaxed by reducing the widths of the sealring wirings M3a, M2a, and M1a. Here, the width of the sealring wiring M3a corresponds to the width (size) in the direction perpendicular to the extending direction of the sealring wiring M3a. Also, the width of the sealring wiring M2a corresponds to the width (size) in the direction perpendicular to the extending direction of the sealring wiring M2a. Further, the width of the sealring wiring M1a corresponds to the width (size) in the direction perpendicular to the extending direction of the sealring wiring M1a.

Further, in the present embodiment, the wiring structure including the wiring layers is formed over the semiconductor substrate SB, but the insulating films (insulating film PA and insulating film RS herein) formed over the wiring structure are further provided. At least part of the pad PD formed in the wiring layer at the uppermost layer is exposed from the openings (openings OP1 and OP2 herein) of the insulating films (insulating film PA and insulating film RS herein). Some parts of the insulating films (insulating film PA and insulating film RS) formed over the wiring structure are interposed between the sealring wiring M5a and the pad PD or the wiring M5 in the wiring layer at the uppermost layer. As described above, there is a fear that the reliability of the semiconductor device is degraded due to the crack being generated in the insulating film interposed between the sealring wiring M5a and the pad PD or the wiring M5 when the above distance L1 is small, etc. In the present embodiment, as described above, it is possible to suppress or prevent the crack from occurring in the insulating film interposed between the sealring wiring M5a and the pad PD or the wiring M5 due to the distance L1 between the sealring wiring M5a and the pad PD or the wiring M5 being large in the wiring layer at the uppermost layer. It is possible to enhance the reliability of the semiconductor device.

Although the invention made above by the present inventors has been described specifically on the basis of the preferred embodiments, the present invention is not limited to the embodiments referred to above. It is needless to say that various changes can be made thereto within the scope not departing from the gist thereof.

Although the five wiring layers are illustrated in the present embodiment, for example, the number of wiring layers is not limited to it. A similar advantageous effect is brought about even in the case of six layers or more or four layers or less.

What is claimed is:

1. A semiconductor device, comprising:
   a semiconductor substrate;
   a wiring structure formed over the semiconductor substrate and including a plurality of wiring layers; and
   a sealring formed along the periphery of the semiconductor substrate in the wiring structure,
   wherein the sealring has a structure in which sealring wirings respectively formed in the wiring layers are laminated, the sealring wirings including a first sealring wiring formed in an uppermost layer of the plurality of wiring layers and a second sealring wiring formed in a wiring layer located one layer lower than the uppermost wiring layer,
   wherein a pad is formed in the uppermost wiring layer,
   wherein the position of a side surface on the inner peripheral side of the first sealring wiring is located more outside than the position of a side surface on the inner peripheral side of the second sealring wiring,
   wherein a width of the first sealring wiring is smaller than a width of the second sealring wiring,
   wherein a thickness of the first sealring wiring is larger than a thickness of the second sealring wiring, and the thickness of the first sealring wiring is the same as a thickness of the pad, and
   wherein a distance between the first sealring wiring and the pad in the uppermost wiring layer is larger than a distance between the second sealring wiring and another wiring in the wiring layer located one layer lower than the uppermost wiring layer.

2. The semiconductor device according to claim 1, wherein the width of the first sealring wiring is the same as the width of a minimum width wiring in the uppermost wiring layer.

3. The semiconductor device according to claim 1, wherein the width of a portion of the second sealring wiring, which overlaps with the first sealring wiring in plan view, is less than or equal to half the width of the second sealring wiring.

4. The semiconductor device according to claim 1, wherein the position of a side surface on the outer peripheral side of the first sealring wiring is the same as the position of a side surface on the outer peripheral side of the second sealring wiring or is located thereoutside.

5. The semiconductor device according to claim 1, wherein the first sealring wiring and the second sealring wiring are coupled by a sealring via portion arranged between the first sealring wiring and the second sealring wiring.

6. The semiconductor device according to claim 1, wherein a width of a sealring wiring formed in a wiring layer lower than the wiring layer in which the second sealring wiring is formed is smaller than a width of the second sealring wiring.

7. The semiconductor device according to claim 1, further comprising insulating films formed over the wiring structure.

8. The semiconductor device according to claim 7, wherein at least part of the pad is exposed from an opening defined in each of the insulating films.

* * * * *